(12) United States Patent
Inaba

(10) Patent No.: US 8,089,817 B2
(45) Date of Patent: Jan. 3, 2012

(54) PRECISE TRCD MEASUREMENT IN A SEMICONDUCTOR MEMORY DEVICE

(75) Inventor: Hideo Inaba, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 204 days.

(21) Appl. No.: 12/489,730

(22) Filed: Jun. 23, 2009

(65) Prior Publication Data

US 2009/0316508 A1 Dec. 24, 2009

(30) Foreign Application Priority Data

Jun. 23, 2008 (JP) ................. 2008-163499

(51) Int. Cl.
  *G11C 7/00* (2006.01)
  *G11C 8/00* (2006.01)
(52) U.S. Cl. ............. 365/189.05; 365/201; 365/230.03; 365/230.06; 365/230.08
(58) Field of Classification Search ............. 365/189.05, 365/189.08, 194, 201, 203, 230.03, 230.06, 365/230.08, 233.1
See application file for complete search history.

(56) References Cited

U.S. PATENT DOCUMENTS

| | | | | |
|---|---|---|---|---|
| 5,481,671 A | * | 1/1996 | Fujisaki | 365/201 |
| 5,914,902 A | * | 6/1999 | Lawrence et al. | 365/201 |
| 5,995,424 A | * | 11/1999 | Lawrence et al. | 365/201 |
| 6,182,253 B1 | * | 1/2001 | Lawrence et al. | 365/201 |
| 6,262,926 B1 | * | 7/2001 | Nakai | 365/201 |
| 6,909,658 B2 | * | 6/2005 | Arimoto et al. | 365/230.03 |
| 7,471,587 B2 | * | 12/2008 | Kawakubo | 365/230.03 |
| 7,573,778 B2 | * | 8/2009 | Nakazawa | 365/230.06 |
| 7,627,792 B2 | * | 12/2009 | Di Ronza et al. | 365/201 |
| 7,646,660 B2 | * | 1/2010 | Tomita | 365/233.1 |

FOREIGN PATENT DOCUMENTS

| | | |
|---|---|---|
| JP | 06-195963 | 7/1994 |
| JP | 08-055495 | 2/1996 |
| JP | 10-333980 | 12/1998 |
| JP | 11-185485 | 7/1999 |
| JP | 2003-346497 | 12/2003 |
| JP | 2004-103051 | 4/2004 |

* cited by examiner

*Primary Examiner* — Trong Phan
(74) *Attorney, Agent, or Firm* — Young & Thompson

(57) ABSTRACT

A semiconductor memory device is operable in normal and test operation modes. At the test operation, in response to a first active command, a row address signal that is input from the outside is captured in the row decoder, and in response to a first write/read command, a column address signal input from the outside is captured in the column decoder. At this time, a word line and a bit line are not selected. Thereafter, in response to a second active command, a word line corresponding to the row address signal is selected in the row decoder, and, in response to a second write/read command, a bit line that corresponds to the column address signal is selected in the column decoder. The time period from the time at which the second read/write command is input to the time at which the second active command is input, is measured as tRCD.

12 Claims, 26 Drawing Sheets

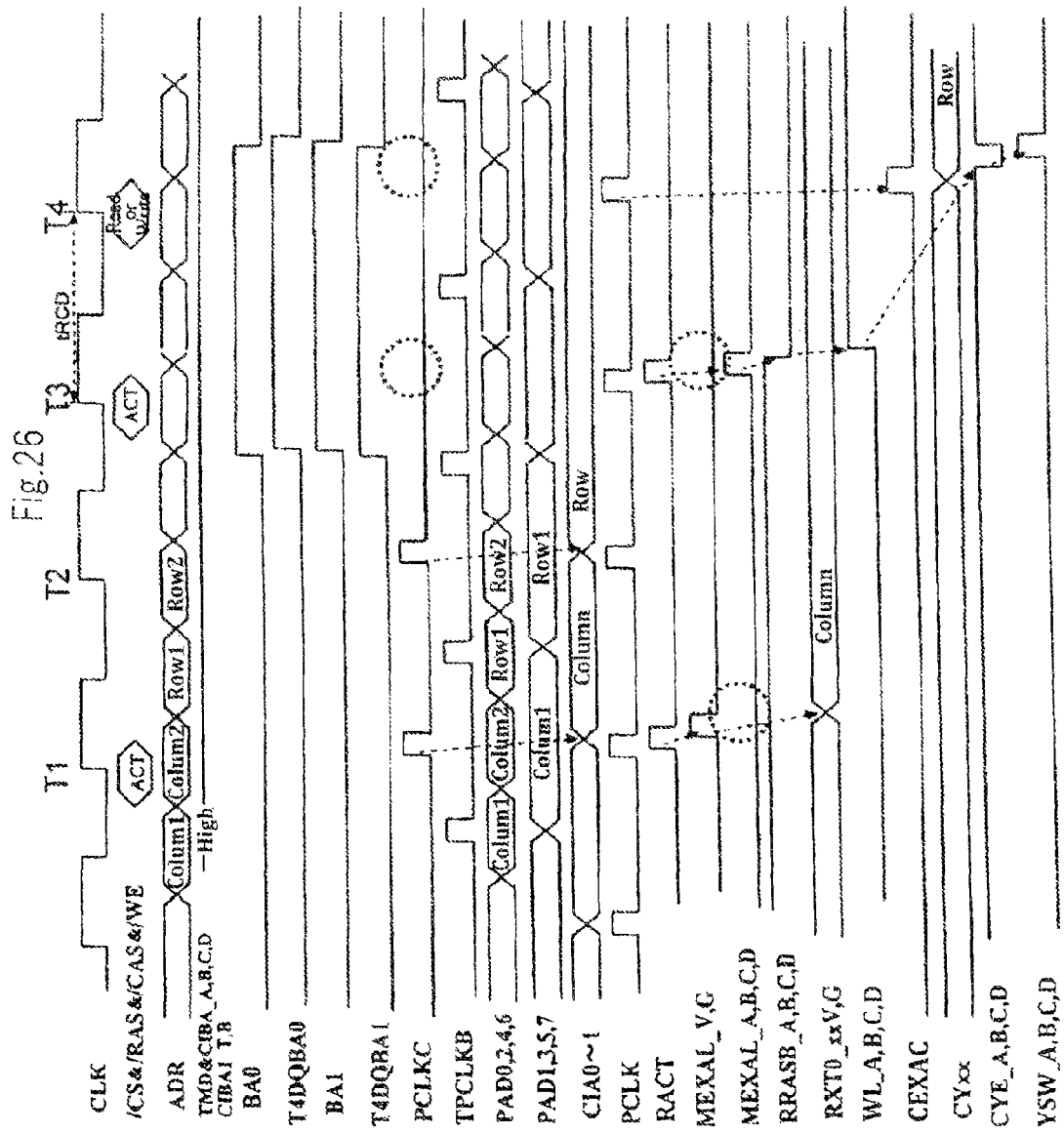

PRECISE TRCD MEASUREMENT IN A SEMICONDUCTOR MEMORY DEVICE

BACKGROUND OF THE INVENTION

1. Technical Field

The present invention relates to a semiconductor memory device having memory cells each connected with a word line and a bit line and being operable in a normal operation mode/a test operation mode which can be set.

2. Description of the Related Art

For the recent semiconductor memory devices, there is an increasing demand to speed up procedures of reading/writing data as the speed of CPU's processing increases. For this reason, not only speeding up the operation clock but also a reduction in a time period from the time at which a command is input to a time at which a subsequent command can be input, is required.

One example of such a predetermined time period which is required from the input of a command to the input of the subsequent command is a time period tRCD from the time at which an active command used in SDRAM (Synchronous DRAM) is input to a time at which a read command for reading data or a write command for writing data can be input.

In general, in a semiconductor memory device, a test (hereinafter referred to as "tRCD test") is performed wherein a read or write command is input after the tRPCD time is elapsed from the input of an active command and it is determined whether or not the semiconductor memory device operates properly.

One example of a method of the tRCD test is disclosed in JP2003-346497A, for example. This patent literature describes in embodiment 1 that an active address is input at the time of input of precharge command PRE after the input of a mode set command, and describes in embodiment 2 that active command ACT and command PACT (a command for latching a low address alone) are input without it being necessary to input an address when active command ACT is input, thus allowing the time of LRCD to be checked.

However, in the case of embodiment 1 of the patent literature, each time a check of all combinations of addresses is made, a mode set command and a precharge command must be input, making the test time lengthy. In the case of embodiment 2 of the patent literature, in which an additional command is input, this command is generated by the combination of RAS, CAS, WE and CAS, and only the combination in which CS is fixed at a level other than a low level (a high level) is left. Therefore, when CS is fixed at a low level in order to concurrently check plural chips, such as when a wafer test is performed, it is impossible to implement the method according to embodiment 2 of the aforementioned patent literature.

The aforementioned tRCD test is performed as part of a wafer screening test. In recent years, in order to increase the number of chips that are concurrently tested in the wafer screening test, a test method (an address degeneracy method) has been proposed wherein in order to reduce the number of driver pins of a tester which are assigned to one chip, an address is latched at both falling and rising edges of a clock signal CLK, allowing different addresses to be entered from common driver pins.

FIG. 1 is a block diagram of a semiconductor memory device which is subjected to such a tRCD test. This semiconductor memory device comprises clock generator 1, address buffer 2, command decoder 9, row decoder 4, column decoder 5 and memory cell array 6.

Memory cell array 6 has a configuration identical to a conventional memory cell array and includes memory cells, word lines, bit lines, sense amplifiers and the like, and inputs/outputs data DQ. Memory cell array 6 also includes Y switches for outputting data on a predetermined bit line to the outside. Selection of a predetermined memory cell is performed by selecting a word line corresponding to a row address that is input from the outside and then selecting a bit line corresponding to a column address that is input from the outside, that is, by turning a corresponding Y switch on.

Clock generator 1 receives clock signals CLK, /CLK, clock enable signal CKE and test mode signal TMD and outputs signals PCLK, PCLKC, TPCLKB. Signal PCLK is a one-shot signal that is generated from a rising edge of clock signal CLK and is used as a pulse signal for latching a command that is input. Signal PCLKC is also a one-shot signal that is generated from a rising edge of clock signal CLK, but is used as a pulse signal for latching an address ADR that is input to address buffer 2 from the outside. Since address buffer 2 and command decoder 9 are distant from one another, signal PCLKC, which is separate from signal PCLK is supplied to address buffer 2. Signal TPCLKB is a one-shot signal that is generated from the falling edge of clock signal CLK, and is used as a pulse signal for latching an address that is input to address buffer 2. Test mode signal TMD is a signal that goes high when the tRCD test is performed. As shown in FIG. 2, clock generator 1 is comprised of inverters 401 to 403, delay circuits 404, 405, AND gate 406, NAND gate 407 and inverters 408, 409.

Address buffer 2 receives 12-bit address ADR, test mode signal TMD and signals PCLKC, TPCLKB, and outputs address signals CIA0 to CIA11. As shown in FIG. 3, address buffer 3 is comprised of inverter 40, buffers 41-0, 41-1, ..., 41-11, D flip-flops 42-0, 42-2, ..., 42-10, transfer gates 43-0, 43-1, ..., 43-11, D flip-flops 44-0, 44-1, ..., 44-11, buffers 45-0, 45-1, 45-11. During the normal operation, test mode signal TMD is at a low level, so that transfer gates 43-0, 43-2, ..., and 43-10 are turned off and transfer gates 43-1, 43-3, ..., and 43-11 are turned on. Accordingly, address signals PAD0, PAD1, ..., PAD11 that are input from respective address terminals ADR0, ADR1, ..., ADR11, are latched to respective D flip-flops 44-0, 44-1, ..., 44-11 by signal PCLKC, and are output to row decoder 4 and column decoder 5 through respective buffers 45-0, 45-1, ..., 45-11 as address signal CIA0, CIA1, ..., CIA11. During the tRCK test, test mode signal TMD is at a high level, so that transfer gates 43-0, 43-2, ..., and 43-10 are turned on and transfer gates 43-1, 43-3, ..., and 43-11 are turned off. Accordingly, address signals PAD0, PAD2, ..., PAD10 that are input from address terminals ADR0, ADR2, ..., ADR10, are latched to respective D flip-flops 42-0, 42-2, ..., 42-10 by signal TPCLKCB, pass through respective transfer gates 43-0, 43-2, ..., 43-10 and are also latched to respective D flip-flops 44-1, 44-3, ..., 44-11 by signal PCLKC. That is, during the tRCK test, addresses, which are the same as the address signals latched to respective D flip-flops 44-0, 44-2, ..., 44-10, are input only from the even-numbered address terminals ADR, ADR2, ..., ADR10 and are latched to D flip-flops 44-1, 44-3, ..., 44-11 for output.

Command decoder 9 receives chip select signal /CS, row address strobe signal /RAS, column address strobe signal /CAS, write enable signal /WE, bank address signals BA0, BA1, signal PCLK, address signals CIA0 to CIA11, and outputs test mode signal TMD, signals RRASB, MEXAL, CEXAC and CYE.

Here, the reason why the number of the bank address signals is two (BA0, BA1) is that the semiconductor memory device shown in FIG. 1 has a 4-bank configuration. Signal RRASB is a signal that is at a low level from the time when active command ACT is input to the time when precharge command PRE is input. Signal MEXAL is a signal that is used, when active command ACT is input, for latching an address that is input at that time, as a row-side selection signal. Signal CEXAC is a signal that is used, when a write/read command is input, for latching an address that is input at that time, as a column-side selection signal. Signal CYE is a signal that is used, when a write/read command is input, as a selection time for Y switch.

As shown in FIG. 4, command decoder 9 is comprised of test command determination circuit 31, active command determination circuit 32, write/read command determination circuit 33, precharge command determination circuit 34, bank-side selection circuit 35, row-side selection circuit 36 and column-side selection circuit 37.

Test command determination circuit 31 receives address signals CIA0 to CIA11 and signal PCLK and outputs test mode signal TMD. Active command determination circuit 32 receives chip select signal /CS, row address strobe signal /RAS, column address strobe signal /CAS, write enable signal /WE, and outputs signal RACT that goes high during the interval of latch signal PCLK when conditions for outputting active command ACT are satisfied. As shown in FIG. 5, active command determination circuit 32 is comprised of D flip-flops 501 to 504, inverters 505, 506 and AND gate 507. Write/read command determination circuit 33 receives chip select signal /CS, row address strobe signal /RAS, column address strobe signal /CAS, write enable signal /WE and outputs signals CEXAC and CYE. Signal CEXAC is used, when a write/read command is input, for latching an address that is input at that time, as a column-side selection signal. Signal CYE is a pulse signal that is output when a write/read command is input, as in signal CEXAC. Signal CYE is output on a path separate from the path of signal CEXAC for ease of time adjustment. As shown in FIG. 6, write/read command determination circuit 33 is comprised of D flip-flops 301, 302, 303, inverters 304, 305, AND gate 306 and inverters 307 to 310. Precharge command determination circuit 34 receives low-level chip select signal /CS row address strobe signal /RAS, write enable signal /WE, high-level column address strobe signal /CAS, and outputs precharge command PRE. Bank-side selection circuit 35 receives bank address signals BA0, BA1, signal PCLK and test mode signal TMD, and outputs bank selection signals CIBA_A to CIBA_D, CIBA1_B and CIBA_T. Bank selection signals CIBA_A to CIBA_D are signals that are used for selecting respective banks A to B and that are determined according to a combination of a high level/a low level of bank address signals BA0 and BA1. Bank selection signals CIBA_B and CIBA_T are also signals for selecting a bank, but are determined according to a high/a low level of bank address signal BA1 alone. The reason why bank address signal BA0 is not used is that a latch circuit in row decoder 4 that is connected with command decoder 9, is shared among banks A and B for the reduction thereof. As shown in FIG. 7, bank-side selection circuit 36 is comprised of D flip-flops 101, 102, AND gates 103 to 106, inverters 107 to 109 and OR gates 110 to 115. Row-side control circuit 36 receives signal RACT, bank selection signals CIBA_A to CIBA_D, CIBA1_B, CIBA_T, precharge command PRE and outputs signals RRASB_A to RRASB_D, MEXAL_V and MEXAL_G. Signals RRASB_A to RRASB_D are signals that are at a low level from the time at which active command ACT is input to the time at which precharge command PRE is input. Signal MEXAL is a signal that is used, when active command ACT is input, for latching an address that is input at that time, as a row-side selection signal. As shown in FIG. 8, row-side control circuit 36 is comprised of AND gates 201 to 206, D flip-flops 207 to 210 and inverters 211 to 214. D flip-flops 207 to 210 receive respective output signals MEXAL_A to MEXAL_D from the clock terminals and are reset by precharge command PRE. Output signals RRASB_A to RRASB_D control the operations of decoders in row decoder 4. Signals MEXAL_V and MEXAL_G control the update operation of latch circuits (D flip-flops) in row decoder 4. Column-side control circuit 37 receives bank selection signals CIBA_A to CIBA_D, signals RRASB_A to RRASB_D and signal CYE, and outputs signals CYE_A to CYE_D. Signals CYE_A to CYE_D are signals that are used, when the write/read command is input, as a selection time for the Y switches of respective banks A to D. As shown in FIG. 9, column-side control circuit 37 is comprised of inverters 601 to 604, NOR gates 605 to 608 and NAND gates 609 to 612.

Row decoder 4 latches address signals CIAxx (where xx=0 to 11) output from address buffer 2 by means of signals MEXAL_V and MEXAL_G output from row-side control circuit 36 in command decoder 9, and decodes word lines WL_A to WL_D by means of decoders that are controlled by signals RRASB_A to RRASB_D output from row-side control circuit 36. As shown in FIG. 10, row decoder 4 is comprised of flip-flops 701, 702, inverters 703 to 706 and decoders 707 to 710. The flip-flop 701 supplies a signal RXT0_xxV in common to the decoder 707,708. The flip-flop 702 supplies a signal RXT0_xxG in common to the decoder 709,710.

Column decoder 5 latches address signals CIAxx (where xx=00 to 11) output from address buffer 2 by means of signal CEXAC output from write/read command determination circuit 33 in command decoder 9. Column decoder 5 then decodes address signals CIAxx by means of signals CYE_A to CYE_D that are output from column-side control circuit 37 and outputs signals to select Y switches YSW_A to YSW_D. As shown in FIG. 11, column decoder 5 is comprised of D flip-flop 801, inverters 802 to 805 and decoders 806 to 809.

FIG. 12 is a timing diagram of the semiconductor memory device shown in FIG. 1 to illustrate the normal operation (addresses are not degenerated) thereof. When chip select signal /CS and row address strobe signal /RAS go low, column strobe signal /CAS and write enable signal /WE go high and therefore active command ACT is activated at time T1, then row address Row is input to address buffer 2 and is latched to D flip-flops 44-0, 44-1, . . . , 44-11 (FIG. 3) by means of signal PCLKC as addresses CIA0 to CIA11. When read command Read or write command Write is input at time T2 which is a time at which clock signal CLK next rises then column address Column is input to address buffer 2 and is latched to D flip-flops 44-0, 44-1, . . . , 44-11 (FIG. 3) by means of signal PCLKC as address CIA0 to CIA11.

FIG. 13 is a timing diagram of the semiconductor memory device shown in FIG. 1 to illustrate the operation thereof when addresses are degenerated to one-half. In FIG. 13, several contents are denoted by the same reference characters as FIG. 12 to omit the further descriptions thereof. In this case, address mode signal TMD is rendered a high level. Even-numbered row address Row1 of address ADR: PAD0, PAD2, PAD4, . . . are latched by means of latch pulse PCLKC that is generated in synchronization with the rising of clock signal CLK, and are output as addresses CIA0, CIA2, CIA4, . . . . Next, odd-numbered row address Row2 of address ADR: PAD1, PAD3, . . . are input from even-numbered terminals of address buffer 2, and are latched to D flip-flops 42-0, 42-2, . . . by means of latch pulse TPCLKB that is generated in synchronization with the falling of clock signal CLK. Addresses PAD1, PAD3, . . . then pass through respective transfer gates 43-0, 43-2, . . . and are latched to respective D flip-flops 44-1, 44-3, ... by means of latch pulse PCLKC. Similarly, even-numbered column address Column1 and odd-numbered column address Column2 are input to address buffer 2 by time T2 at which read command Read or write command Write is input, and are output as address signals CIA0 to CIA11.

FIG. 14 is a timing diagram of the semiconductor memory device shown in FIG. 1 to illustrate the operation of the command decoder when tRCD check is performed. In FIG. 14, several contents are denoted by the same reference characters as FIG. 12 to omit the further descriptions thereof.

First, a description is made of the operation when active command ACT is input at time T1. When clock signal CLK goes high, a high level one-shot signal is generated by clock generator 1 as signal PCLK. At this time, active command ACT is activated because chip select signal /CS and row address strobe signal /RAS are at a low level and column address strobe signal /CAS and write enable signal /WE are at high level. When active command ACT is activated, active command determination circuit 32 renders its output signal RACT high, the width of which is identical to the width of signal PCLK. When test mode signal TMD is at a high level, signals CIBA_A to CIBA_D, CIBA1_B and CIBA_T that are output from bank-side selection circuit 35 are all at a high level. As a result of signal RACT being rendered high, internal signals MEXAL_A to MEXAL_D and output signals MEXAL_V and MEXAL_G of row-side control circuit 36 are also rendered high, and hence output signals RRASB_A to RRASB_D of inverters 211 to 214 (FIG. 8) are rendered low. Addresses CIA0 to CIA11 are output with the input of address signals when the active command is activated. Signals RXT0_xxV and RXT0_xxG (where xx=00 to 11) are output with the input of signals MEXAL_V and MEXAL_G. Decoders 707 to 710 (FIG. 10) are operated through the input of low-level signals RRASB_A to RRASB_D, with the result that word lines WL_A,B,C,D to which an address of memory cell array 6 is input is selected.

Next, a description is made of an operation when a write or read command is entered at time T2. As with the operation at time T1, at time T2 as well, a high level one-shot signal is generated as signal PCLK. At this time, since the read or write command is input (chip select signal /CS is at a low level, row address strobe signal /RAS is at a high level and column address strobe signal /CAS is at low level), write/read command determination circuit 33 renders its output signals CEXAC and CYE high, the widths of which are identical to the width of signal PCLK. As explained hereinabove, since signals RRASB_A to RRASB_D are at a low level and signals CIBA_A to CIBA_D are at a high level, column-side control circuit 37 renders its output signals CYE_A to CYE_D low, the widths of which are identical to the width of signal CYE. As with the operation when active command ACT is activated, addresses CIA0 to CIA11 are output that correspond to the address signals that are input when the active command is activated, and signal CYxx is output through the input of signal CEXAC. Decoders 806 to 809 (FIG. 11) are operated through the input of low-level signals CYE_A to CYE_D, with the result that any one of Y switches YSW_A to YSW_D is selected. Thereafter, the time period tRCD between time T1 at which the active command is input and T2 at which the read or write command is input, i.e., between the time at which a word line is selected and the time at which a Y switch is selected, is measured and its shortness is evaluated as the performance of tRCD.

Thus, addresses of a semiconductor memory device, when they are not degenerated, are entered from corresponding address pins in synchronization with a falling edge or rising edge of the clock signal CLK. On the other hand, when addresses of a semiconductor memory device are degenerated, for example, address pins are reduced to one-half, different addresses are entered from address pins (even-numbered pins in the above example) from which addresses can be entered at the time of address degeneracy, in synchronization with both falling and rising edges of clock signal CLK. When address degeneracy is not performed (including a normal operation), tRCD does not depend on the amount of time that is used to capture addresses, as shown in FIG. 12. The reason for this is that because addresses are entered in synchronization with one of the falling and rising edges of clock signal CLK, it is possible to take an ample amount of time to capture row addresses and to capture column addresses. Meanwhile, when address degeneracy is performed, there arises a case in which the performance of tRCD cannot be precisely measured due to the influence of the amount of time that is used to capture column address Column1. That is, tRCD that should not depend on the amount of time that is used to capture addresses at the normal operation, depends on the amount of time that is used to capture addresses at the address degeneracy test. Thus, accurate evaluation of tRCD at the address degeneracy test is made impossible.

SUMMARY

The present invention seeks to solve one or more of the above problems.

At the test operation mode, in response to a first active command, a row address signal that is input from the outside is captured in the row decoder, and in response to a first write/read command, a column address signal that is input from the outside is captured in the column decoder. At this time, a word line and a bit line are not selected. Thereafter, in response to a second active command, a word line that corresponds to the row address signal is selected in the row decoder, and, in response to a second write/read command, a bit line that corresponds to the column address signal is selected in the column decoder. The time period from the time at which the second write/read command is input to the time at which the second active command is input, is measured as tRCD.

In place of capturing a column address in the column decoder in response to the first read/write command, the column address that is held in an address buffer may be captured in the column decoder at the time at which the second write/read command is input. The procedures when the column address is input in the address buffer earlier than the row address are similar to the above described procedures.

Since the tRCD measurement is performed after latching an address, the performance of tRCD can be evaluated without being affected by the amount of time that is used to capture an address.

BRIEF DESCRIPTION OF THE DRAWINGS

The above and other objects, features and advantages of the present invention will become more apparent from the following description of certain preferred embodiments taken in conjunction with the accompanying drawings, in which:

FIG. 26 is a timing chart illustrating the operation of a semiconductor memory device of a fourth exemplary embodiment.

DESCRIPTION OF THE PREFERRED EMBODIMENTS

1st Exemplary Embodiment

Figure 1:
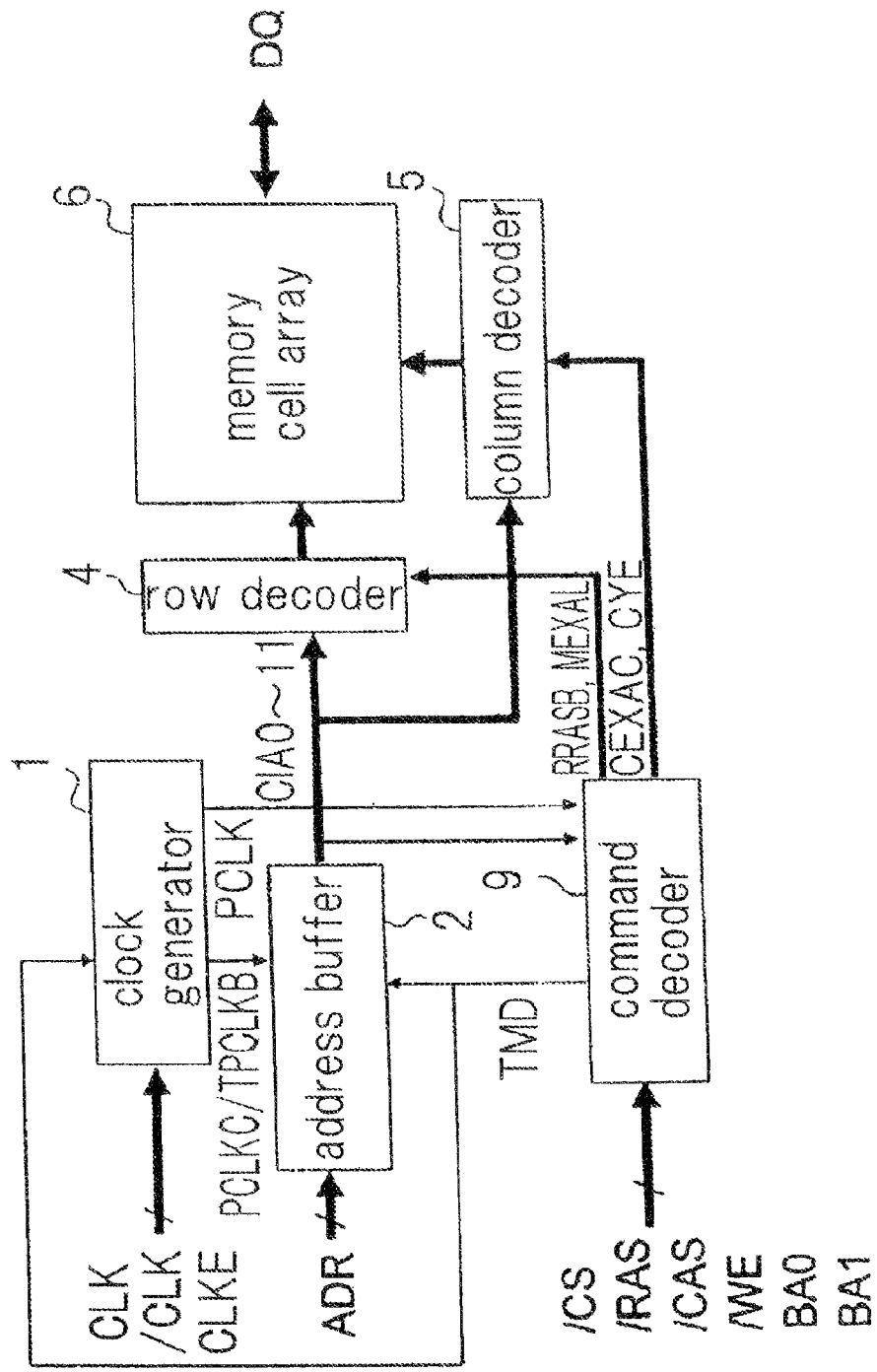
FIG. 1 is a block diagram of a conventional semiconductor memory device.
Figure 15:
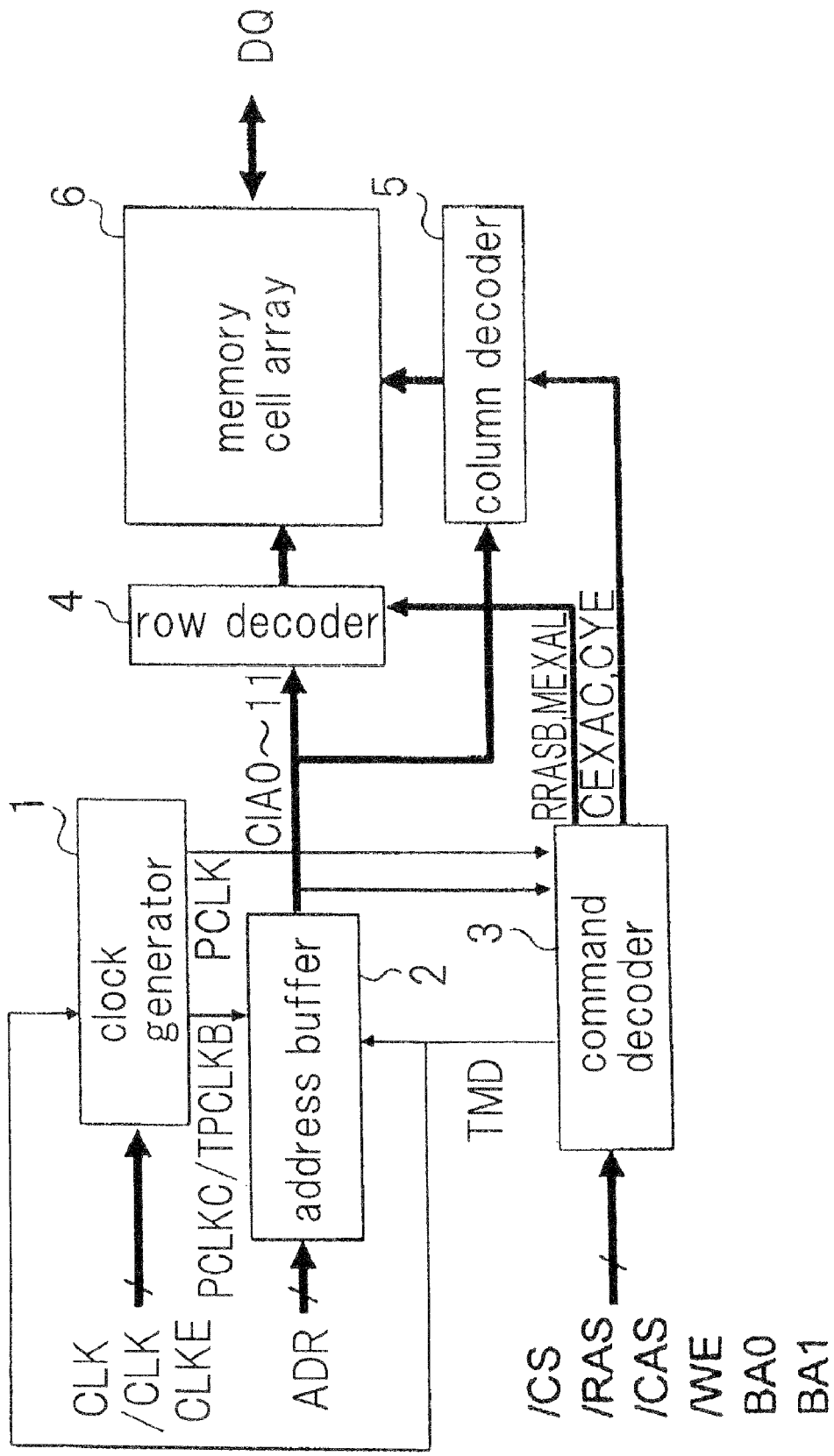
FIG. 15 is a block diagram of a semiconductor memory device according to a first exemplary embodiment of the present invention.

FIG. 15 is a block diagram of a semiconductor memory device according to a first exemplary embodiment of the present invention. The semiconductor memory device of the first exemplary embodiment comprises clock generator 1, address buffer 2, command decoder 3, row decoder 4, column decoder 5 and memory cell array 6. The semiconductor memory device of the first exemplary embodiment differs from the semiconductor memory device shown in FIG. 1 in that command decoder 3 differs from command decoder 9. Therefore, the remaining constituents of FIG. 15 are denoted by the same reference characters as FIG. 1 to omit the further descriptions thereof.

Figure 4:
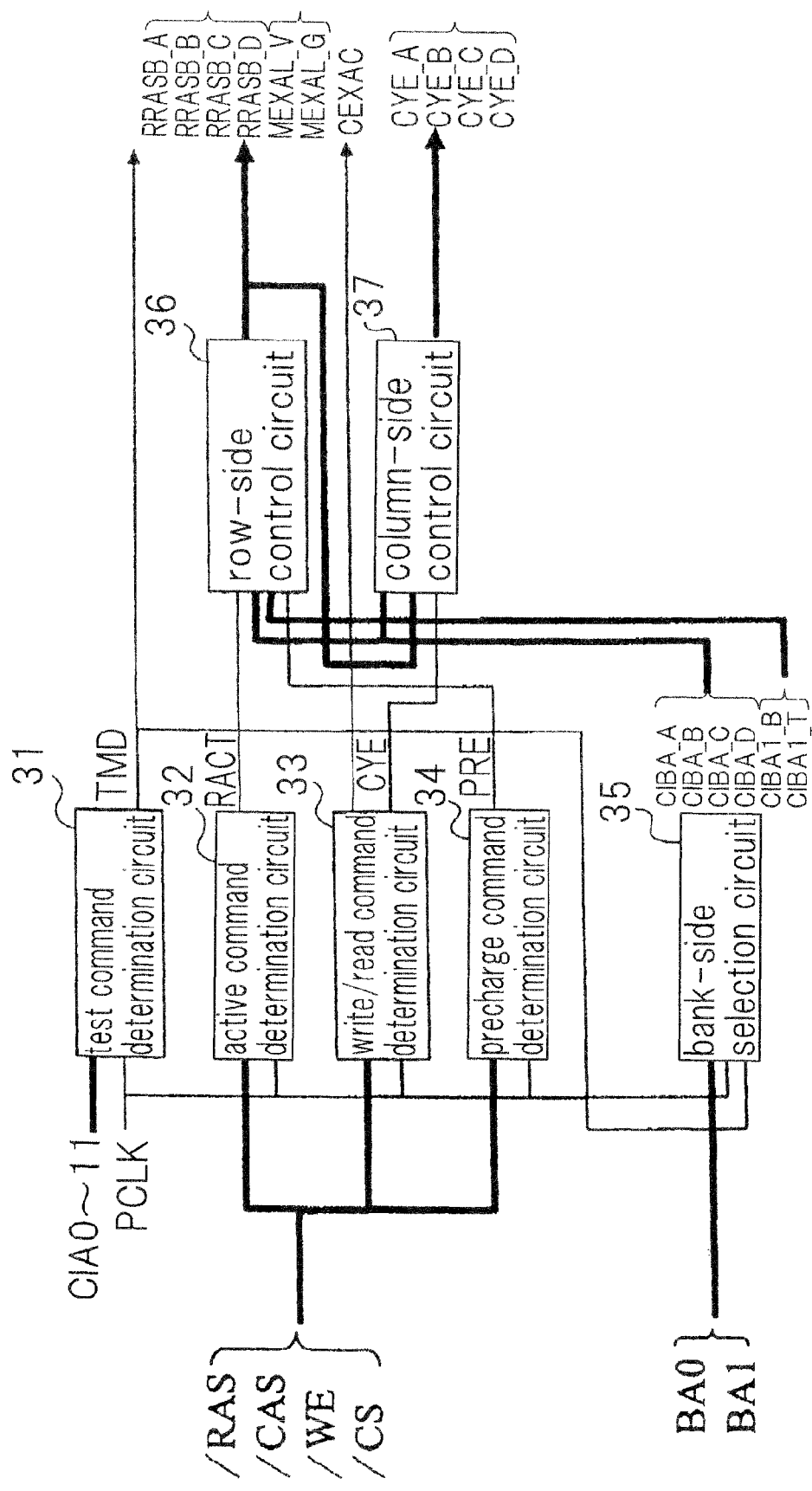
FIG. 4 is a circuit diagram of a command decoder shown in FIG. 1.
Figure 5:
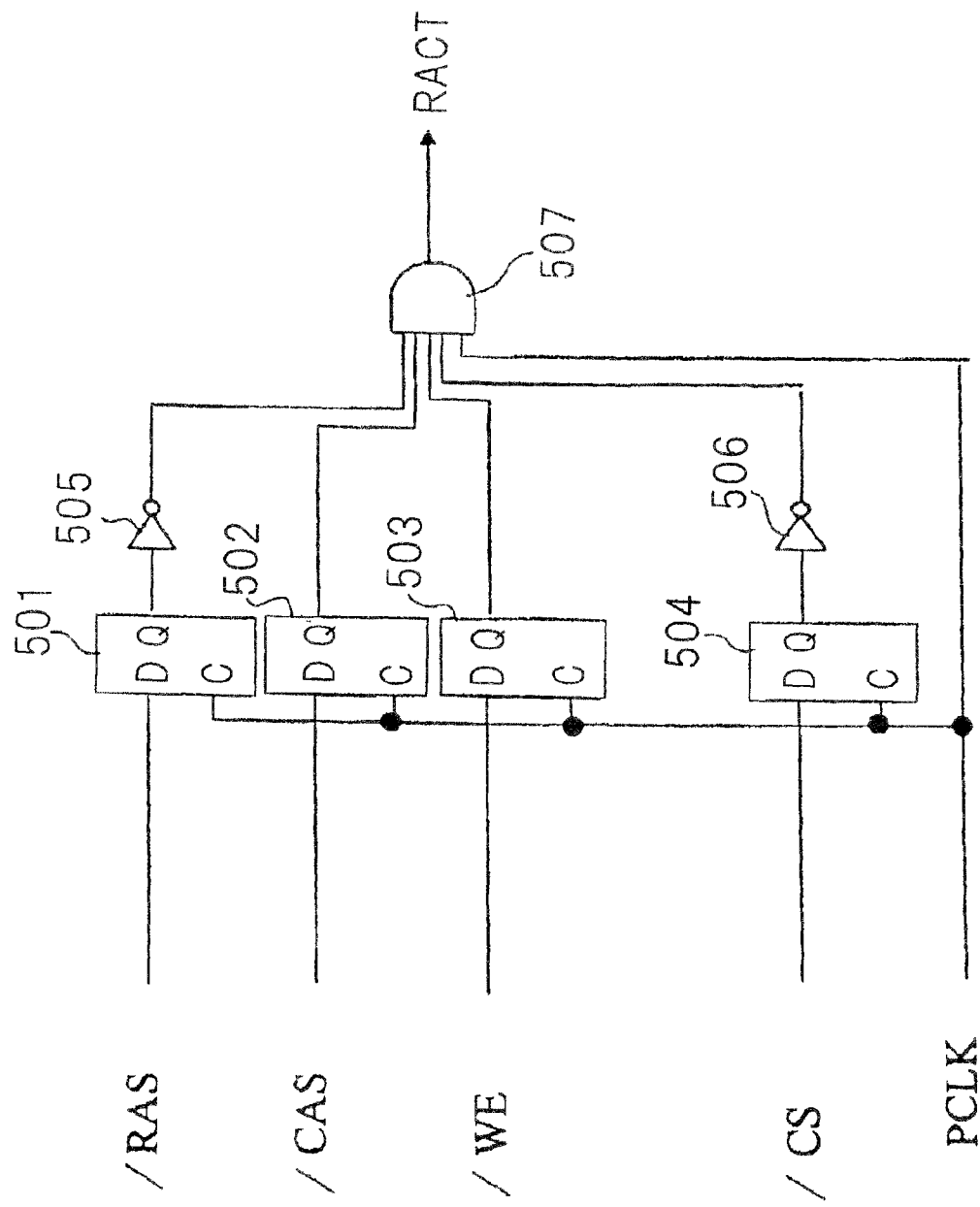
FIG. 5 is a circuit diagram of an active command determination circuit shown in FIG. 4.
Figure 16:
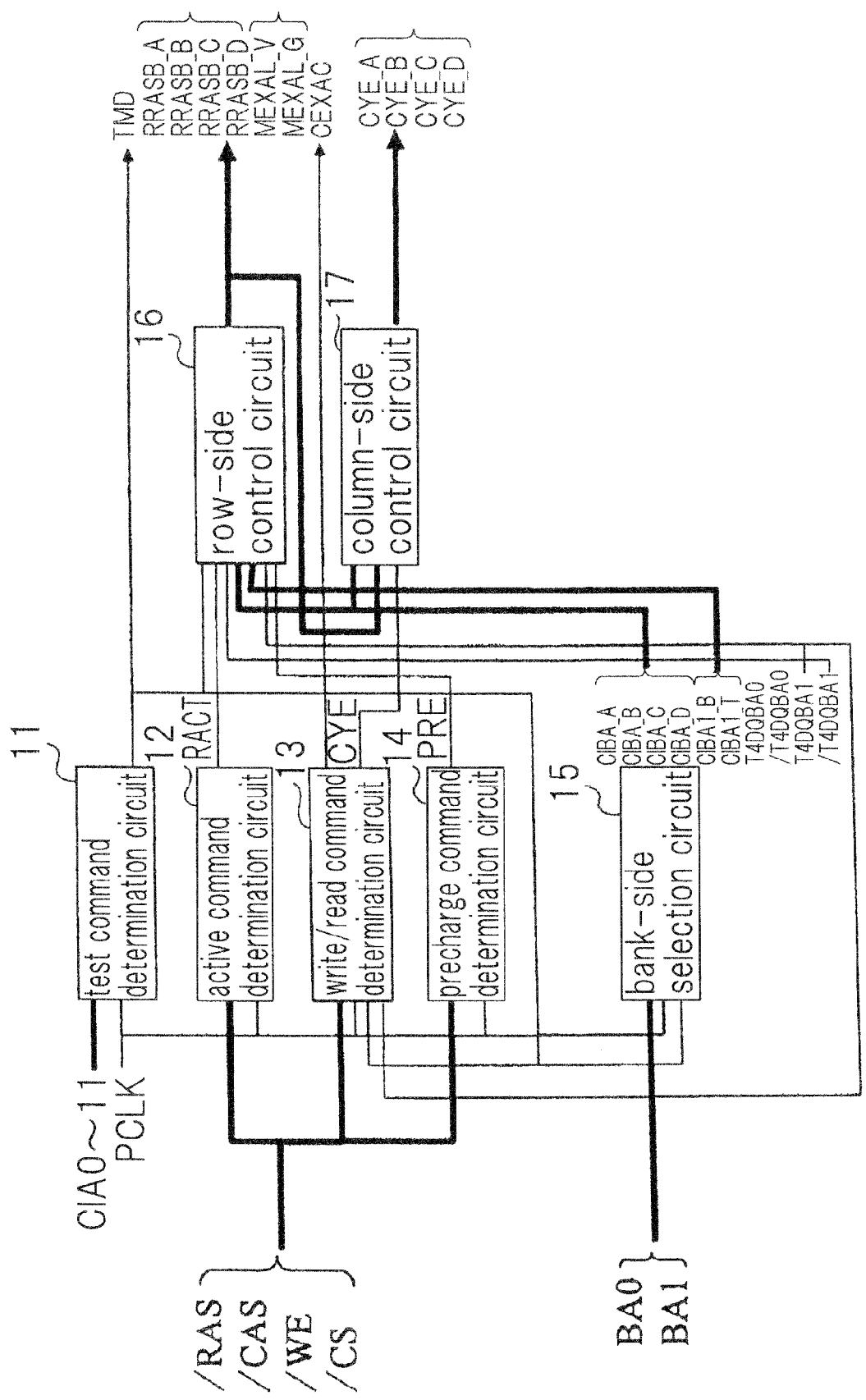
FIG. 16 is a block diagram of a command decoder shown in FIG. 15.

FIG. 16 is a block diagram of command decoder 3. Command decoder 3 includes test command determination circuit 11, active command determination circuit 12, write/read command determination circuit 13, precharge command determination circuit 14, bank-side selection circuit 15, row-side control circuit 16 and column-side control circuit 17. Command decoder 3 differs from command decoder 9 shown in FIG. 1 in that write/read command determination circuit 13, bank-side selection circuit 15 and row-side control circuit 16 differ from write/read command determination circuit 33, bank-side selection circuit 35 and row-side control circuit 36, respectively. Test command determination circuit 11, active command determination circuit 12, precharge command determination circuit 14 and column-side control circuit 17 have the same configuration of test command determination circuit 31, active command determination circuit 32, precharge command determination circuit 34 and column-side control circuit 37, respectively. Therefore, the remaining contents of FIG. 16 are denoted by the same reference characters as FIG. 4 to omit the further descriptions thereof.

Figure 17:
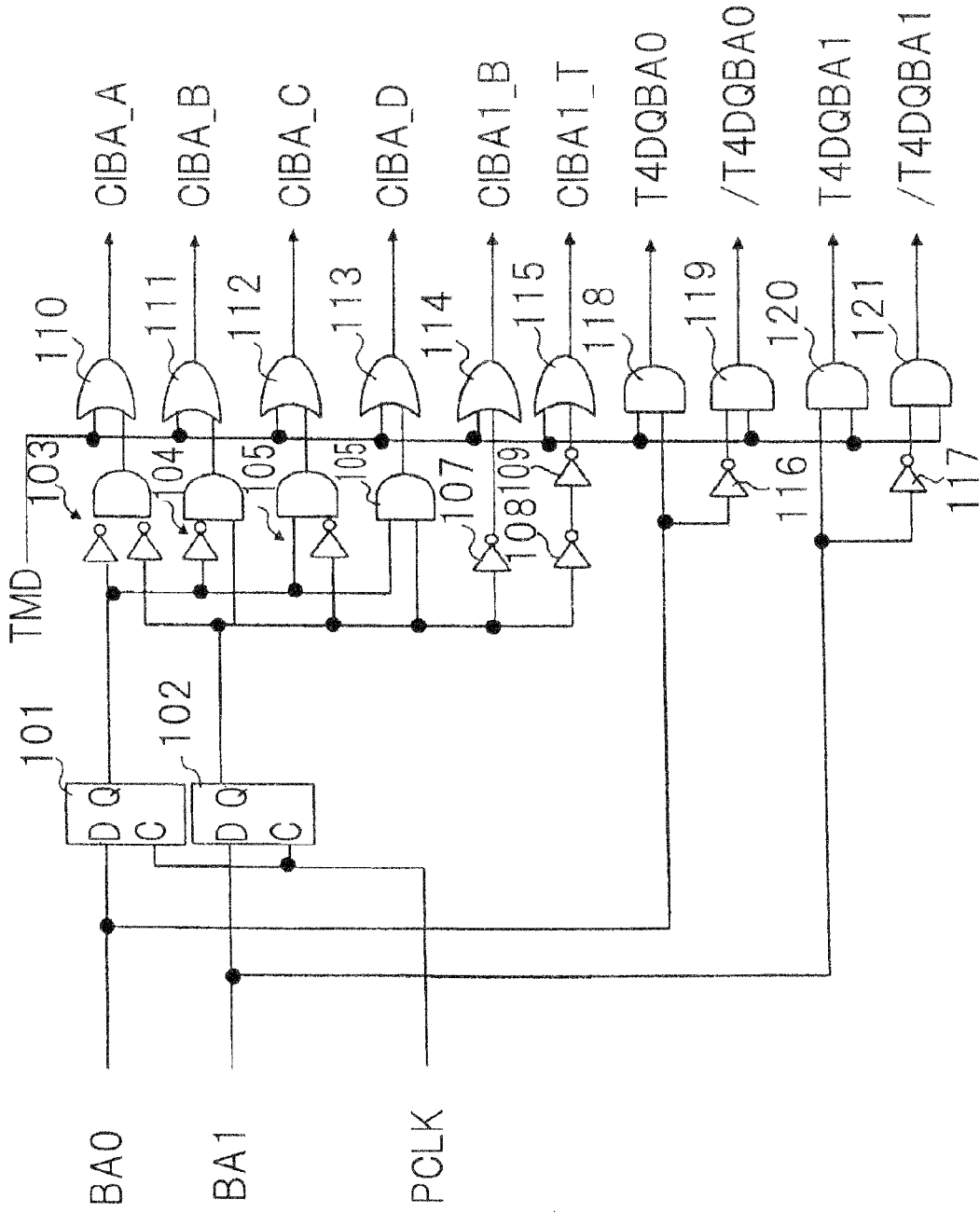
FIG. 17 is a circuit diagram of a bank-side selection circuit shown in FIG. 16.

FIG. 17 is a block diagram of bank-side selection circuit 15. Bank-side selection circuit 15 has the configuration wherein inverters 116, 117 and AND gates 118 to 121 have been added to bank-side selection circuit 35. Specifically, in addition to bank selection signals CIBA_A to CIBA_D, CIBA1_B. CIBA1_T that are always at high levels at the time of the test mode, bank-side selection circuit 15 outputs test signals T4DQBA0, /T4DQBA0, T4DQBA1 and /T4DQBA1 based on bank address signals BA0 and BA1.

Figure 8:
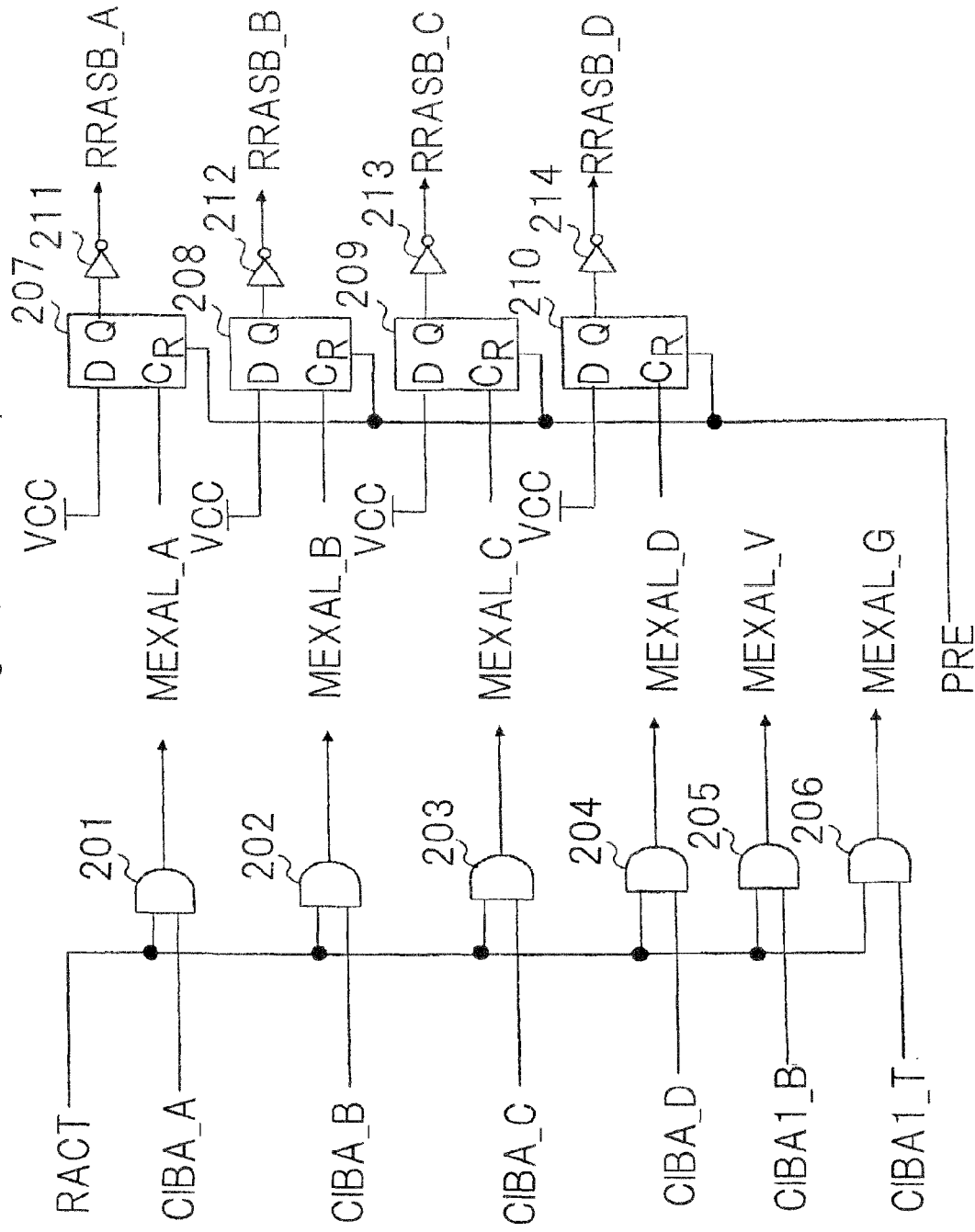
FIG. 8 is a circuit diagram of a row-side control circuit shown in FIG. 4.
Figure 18:
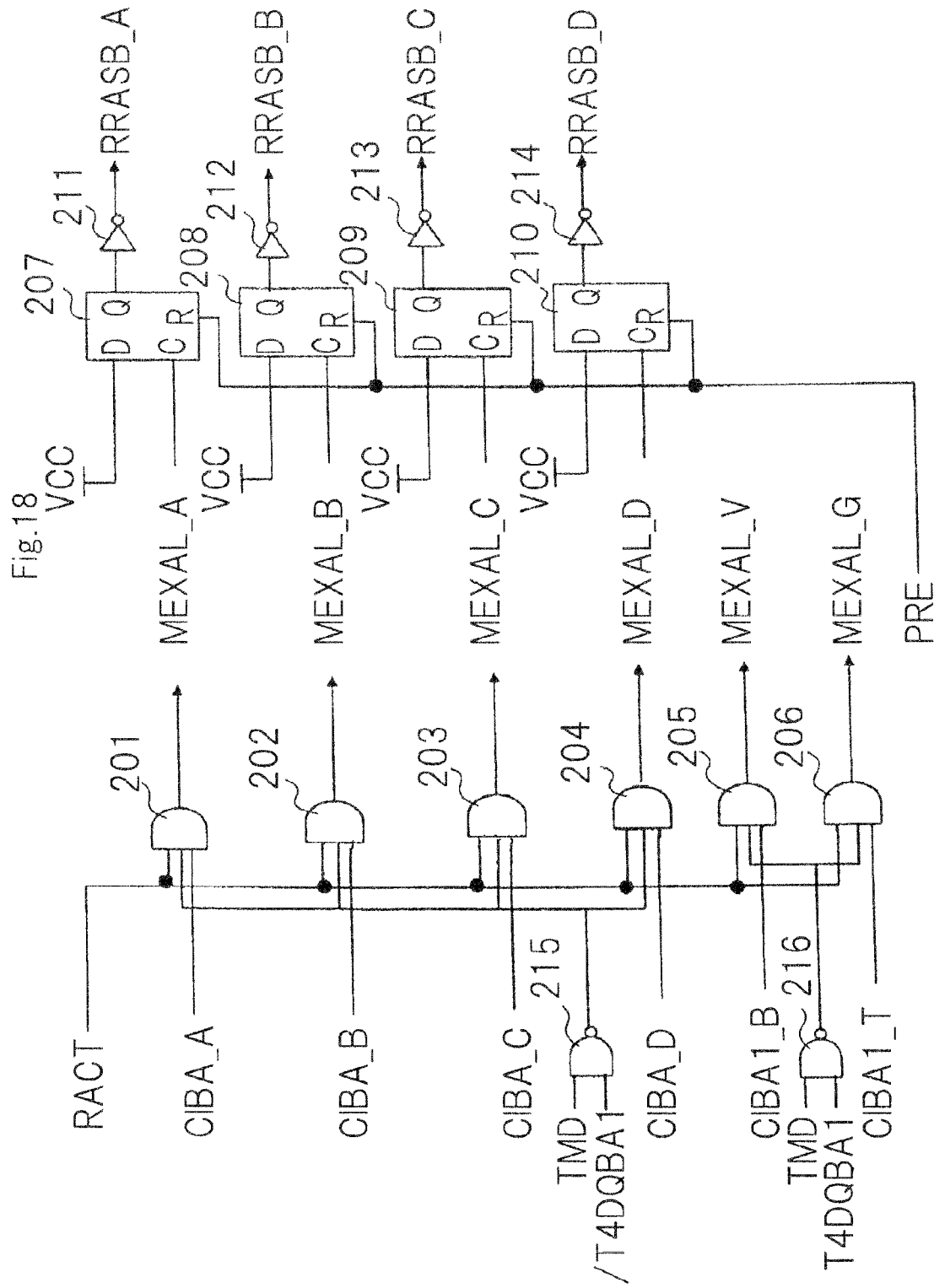
FIG. 18 is a circuit diagram of a row-side selection circuit shown in FIG. 16.

FIG. 18 is a circuit diagram of row-side control circuit 16. Row-side control circuit 16 has a configuration wherein NAND gate 215 which receives test mode signal TMD and test signal /T4DQBA1 and which provides its output to AND gates 201 to 204, and NAND gate 216 which receives test mode signal TMD and test signal T4DQBA1 and which provides its output to AND gates 205 and 206, have been added to row-side control circuit 36 shown in FIG. 8. Thus, the provision of NAND gates 215 and 216 makes it possible to complementarily control the active/inactive state of signals MEXAL_A to MEXAL_D and signals MEXAL_V and MEXAL_G.

Figure 9:
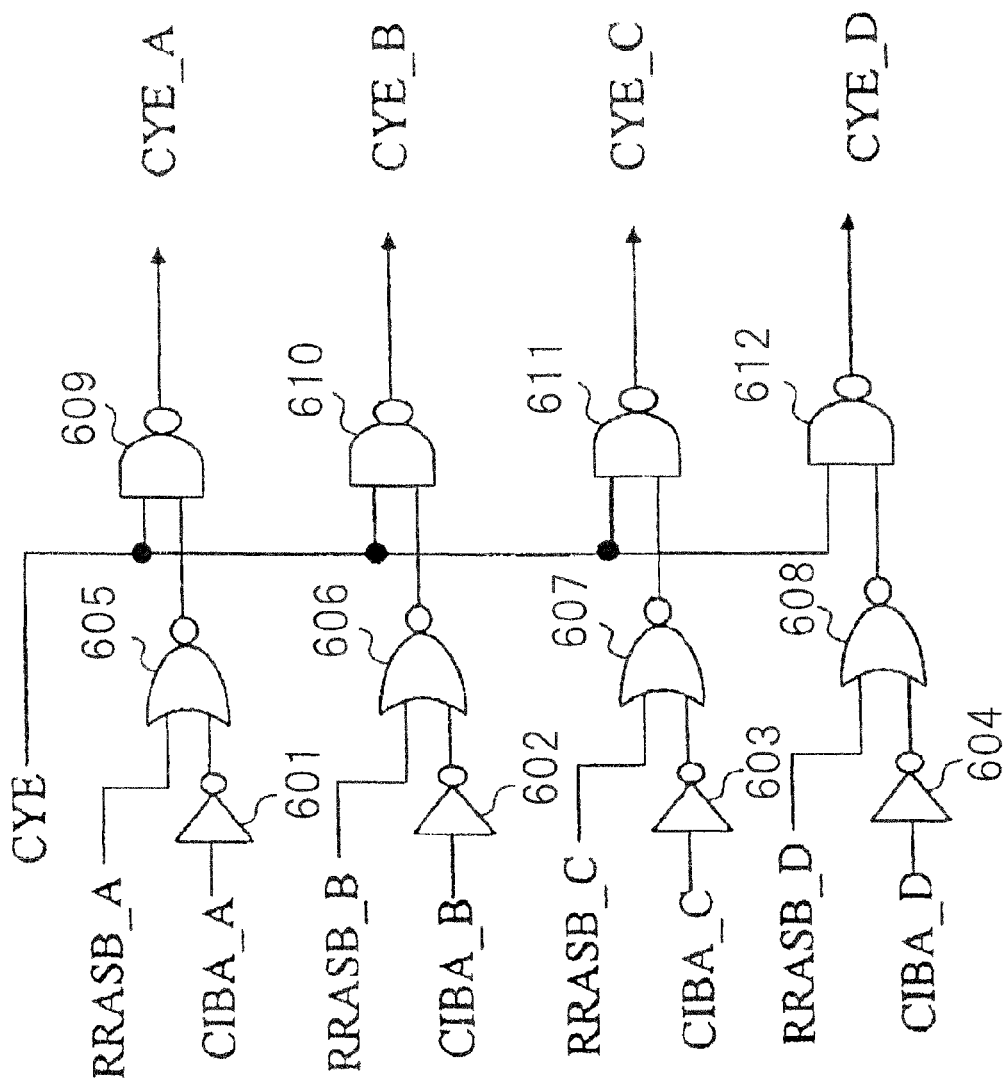
FIG. 9 is a circuit diagram of a column-side control circuit shown in FIG. 4.

By configuring bank-side selection circuit 15 and row-side control circuit 16 described above, it is possible to control the operations of decoders 707 to 710 in row decoder 4 and the row address update operation of the latch circuits (D flip-flops 701, 702) in row decoder 4 using bank address signal BA1 Specifically, it is possible to perform a control such that the row address input operation alone is performed at the first active command ACT after precharge command PRE is input, and such that the operations of decoders 707 to 710 in row decoder 4 alone are performed at the next active command ACT. It is to be noted that signals RRASB_A to RRASB_D are also used as one of the control signals in column-side control circuit 17 (FIG. 9).

Figure 6:
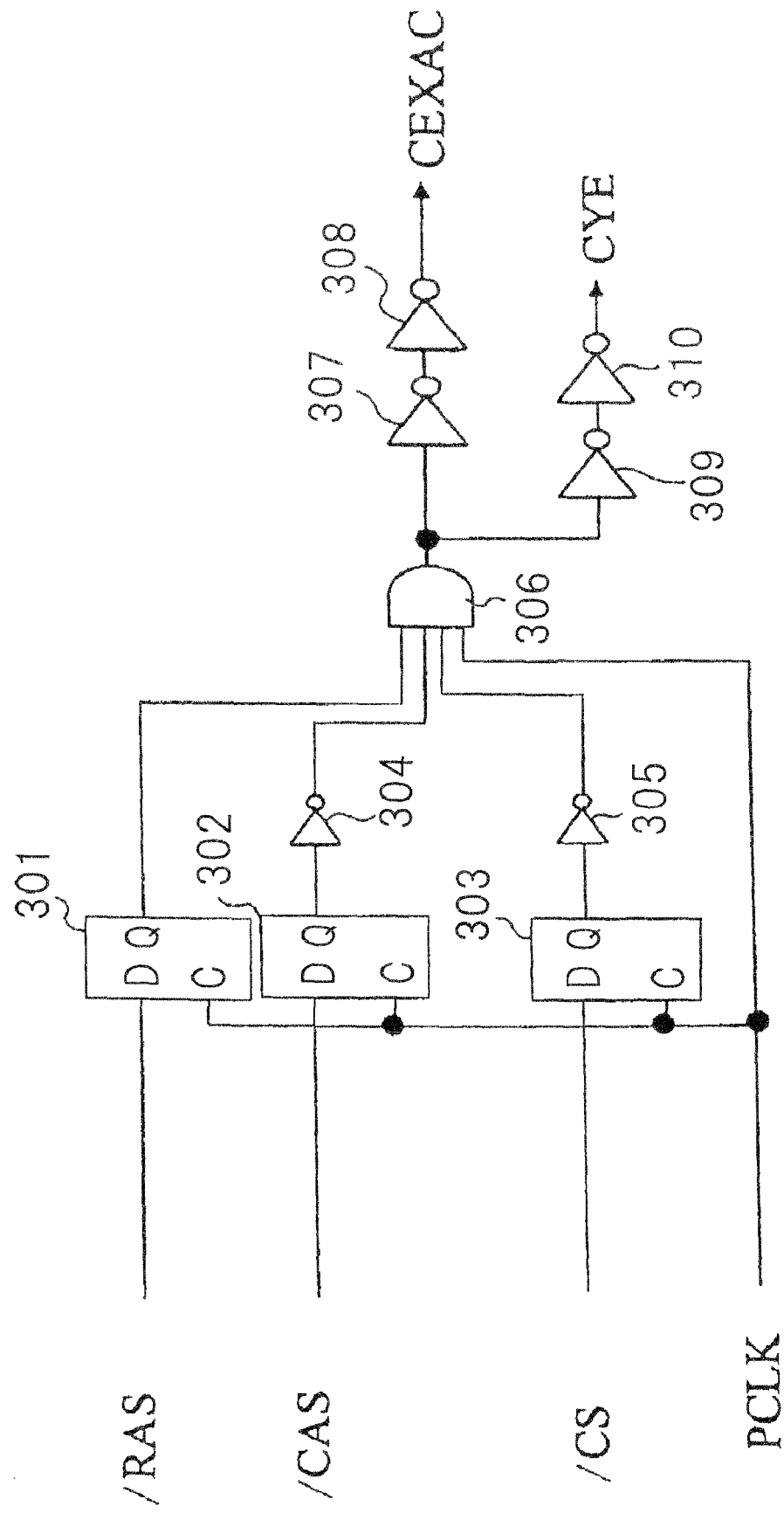
FIG. 6 is a circuit diagram of a write/read command determination circuit shown in FIG. 4.
Figure 7:
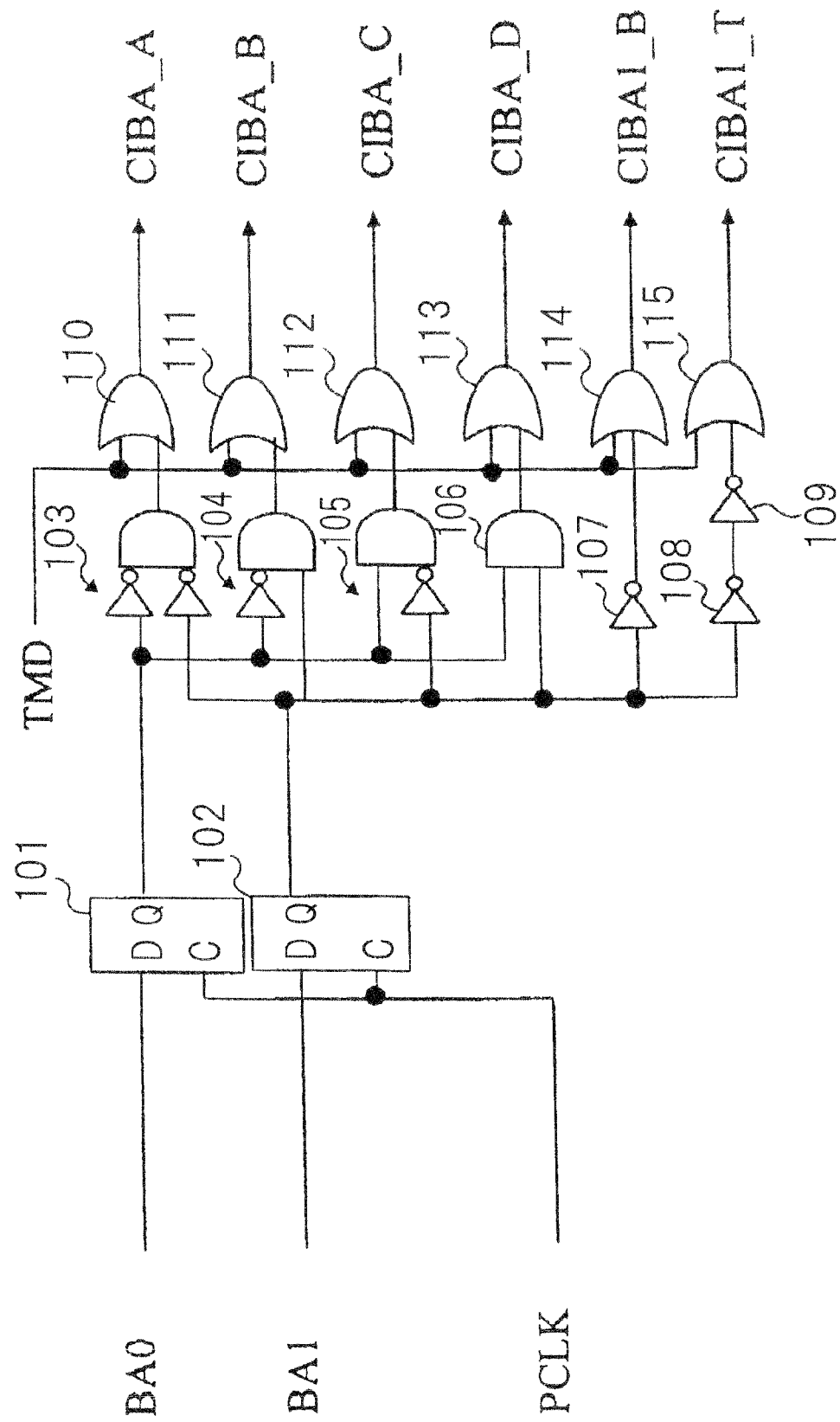
FIG. 7 is a circuit diagram of a bank-side selection circuit shown in FIG. 4.
Figure 19:
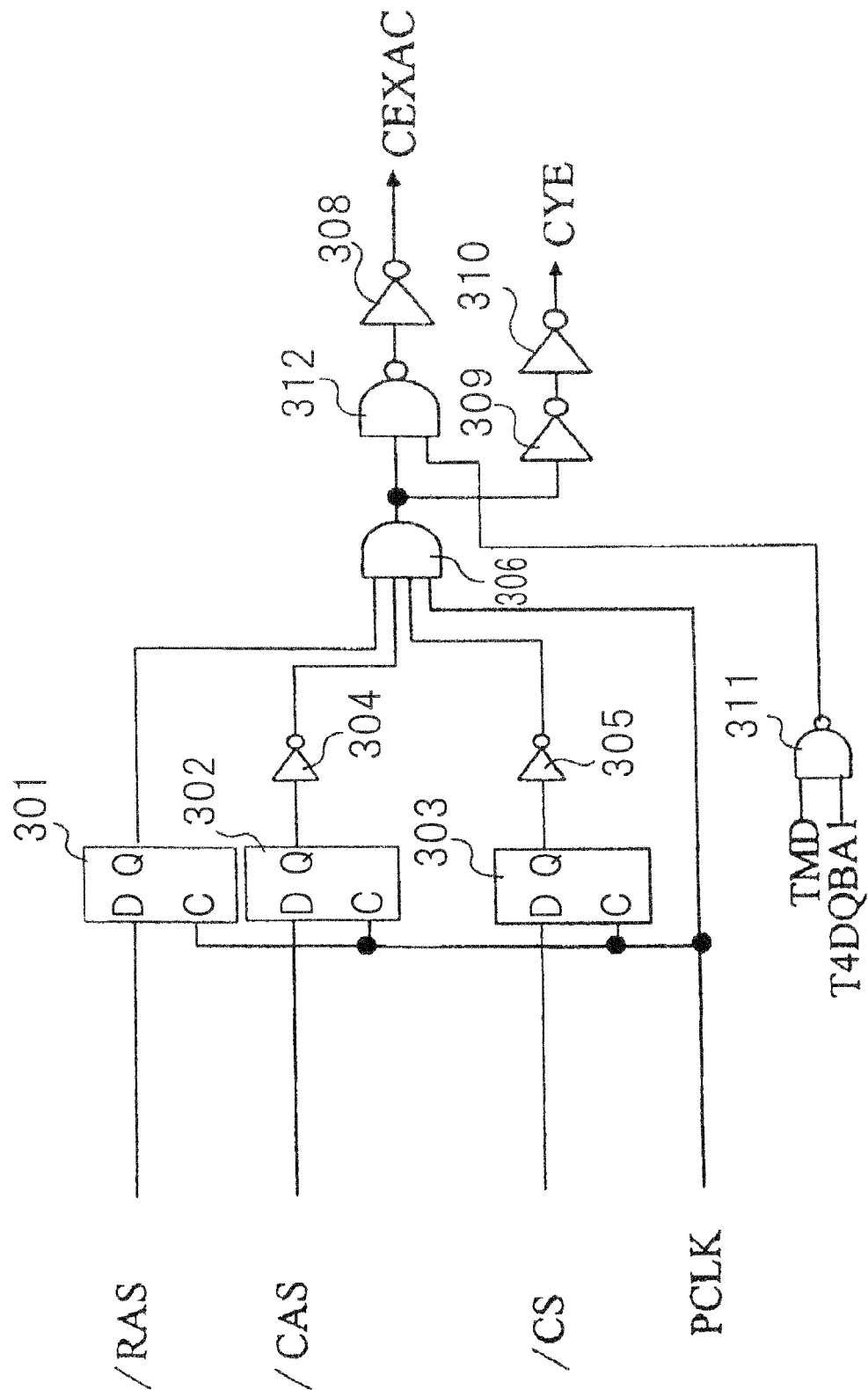
FIG. 19 is a circuit diagram of a write/read command determination circuit shown in FIG. 16.

FIG. 19 is a circuit diagram of write/read command determination circuit 13. Write/read command determination circuit 13 has a configuration wherein NAND gate 311 that receives test mode signal TMD and test signal T4DQBA1 is added to write/read command determination circuit 33 in FIG. 6, and wherein inverter 307 in write/read command determination circuit 33 is replaced with NAND gate 312 that receives the output of AND gate 306 and the output of NAND gate 311.

By configuring write/read command determination circuit 13 described above, it is possible to control the operations of decoders 806 to 809 in column decoder 5 and the column address update operation of the latch circuit (D flip-flop 801) in column decoder 5 using bank address signal BA1 Specifically, it is possible to perform a control such that the column address input operation alone is performed at the first write/read command ACT after precharge command PPF is input, and such that the operations of decoders 806 to 809 in column decoder 5 alone are performed at the write/read command ACT after the operation of row decoder 4.

Figure 12:
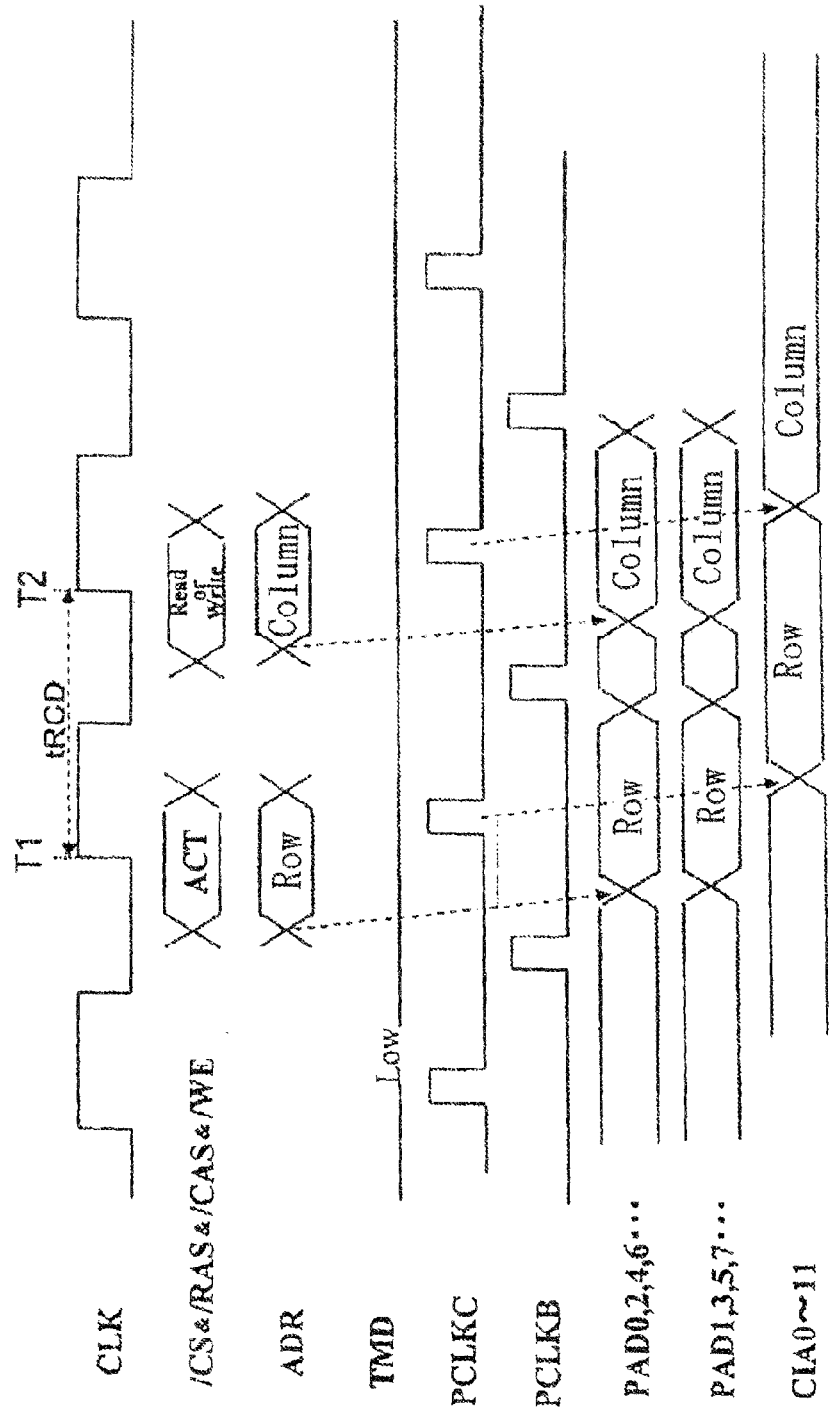
FIG. 12 is a timing chart illustrating the operation of the semiconductor memory device shown in FIG. 1 when addresses are not degenerated (normal operation)
Figure 13:
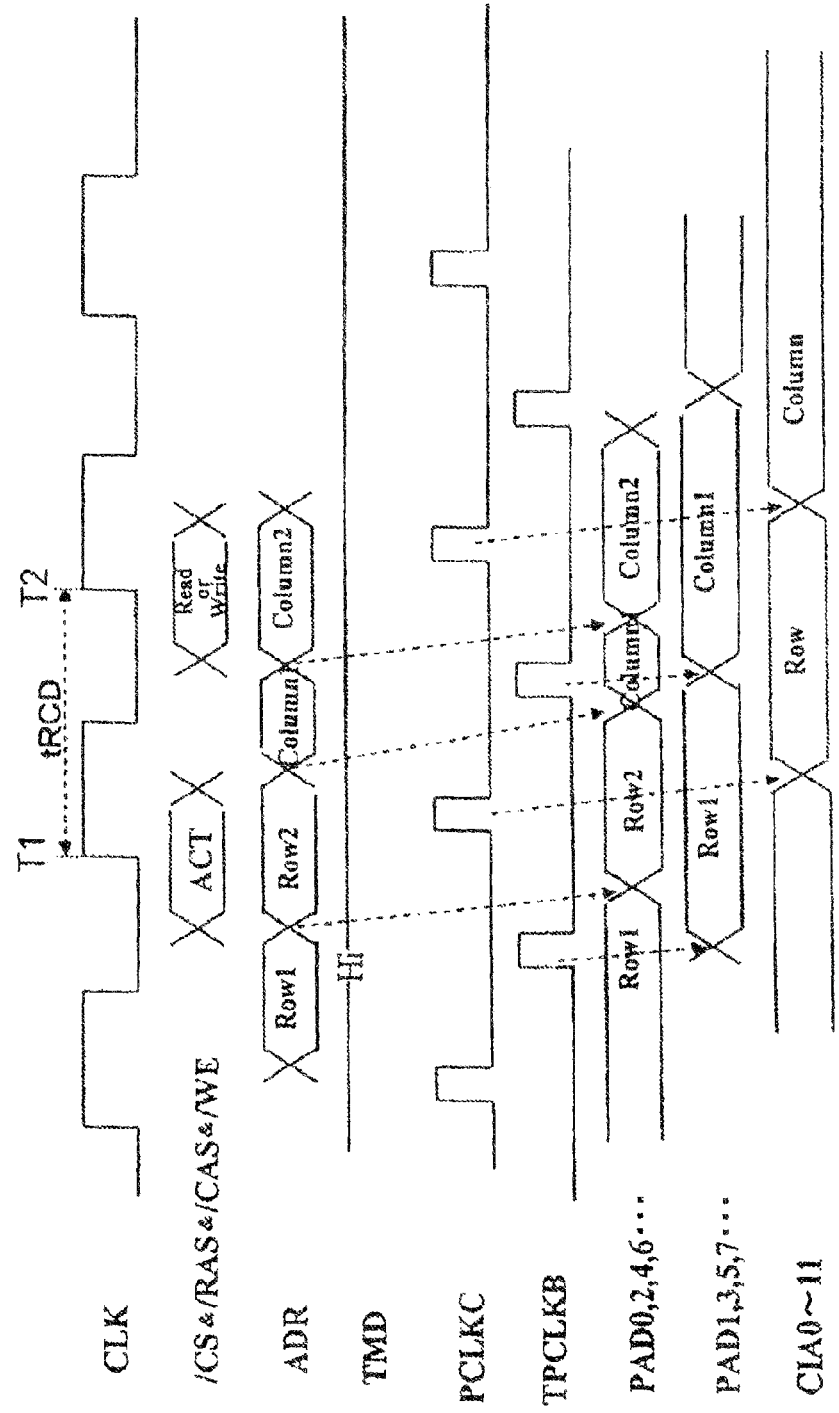
FIG. 13 is a timing chart illustrating the operation of the semiconductor memory device shown in FIG. 1 when addresses are degenerated (normal operation)
Figure 14:
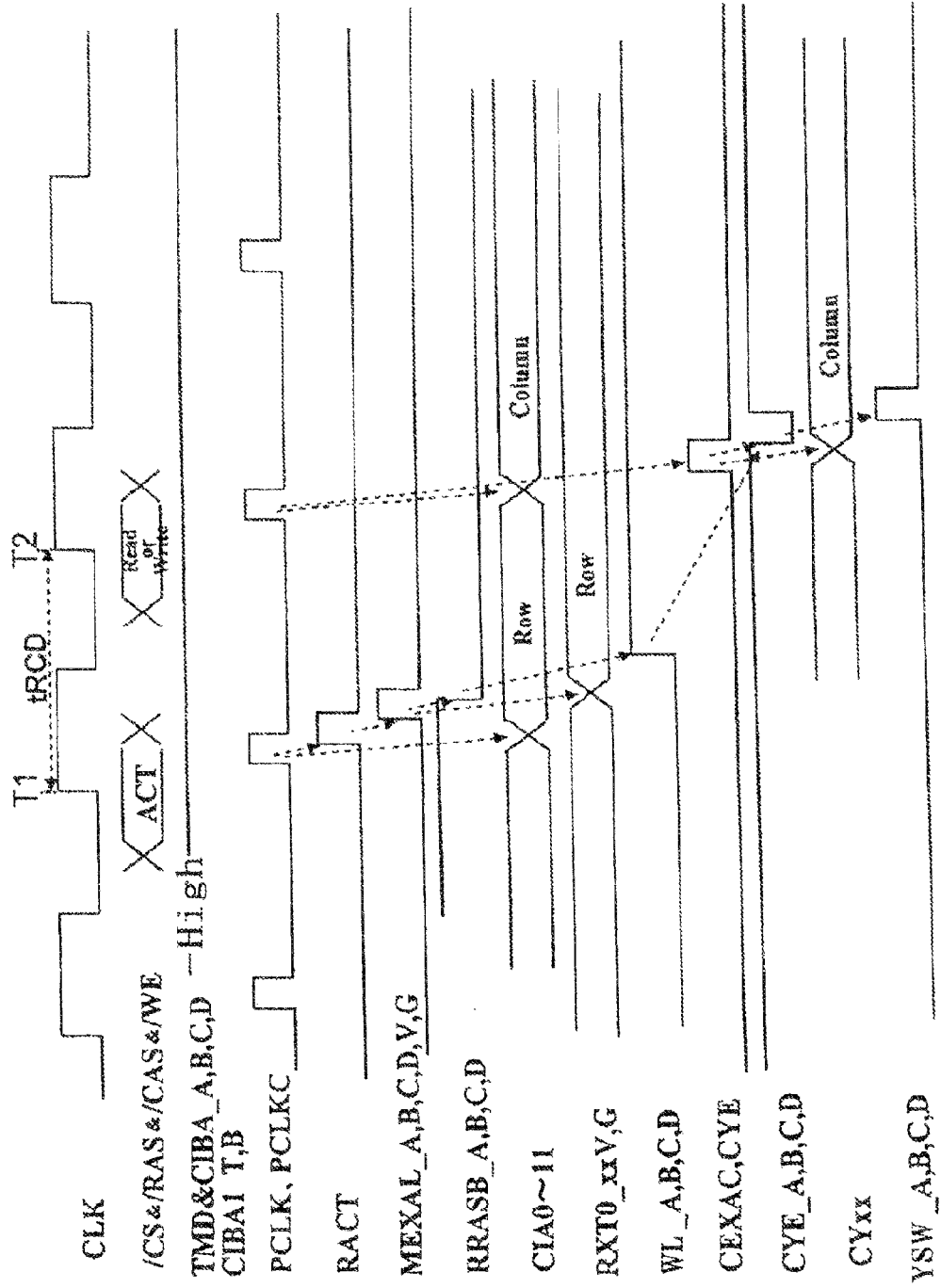
FIG. 14 is a timing chart illustrating the operation of the semiconductor memory device shown in FIG. 1 when tRCD check is performed in the command decoder.
Figure 20:
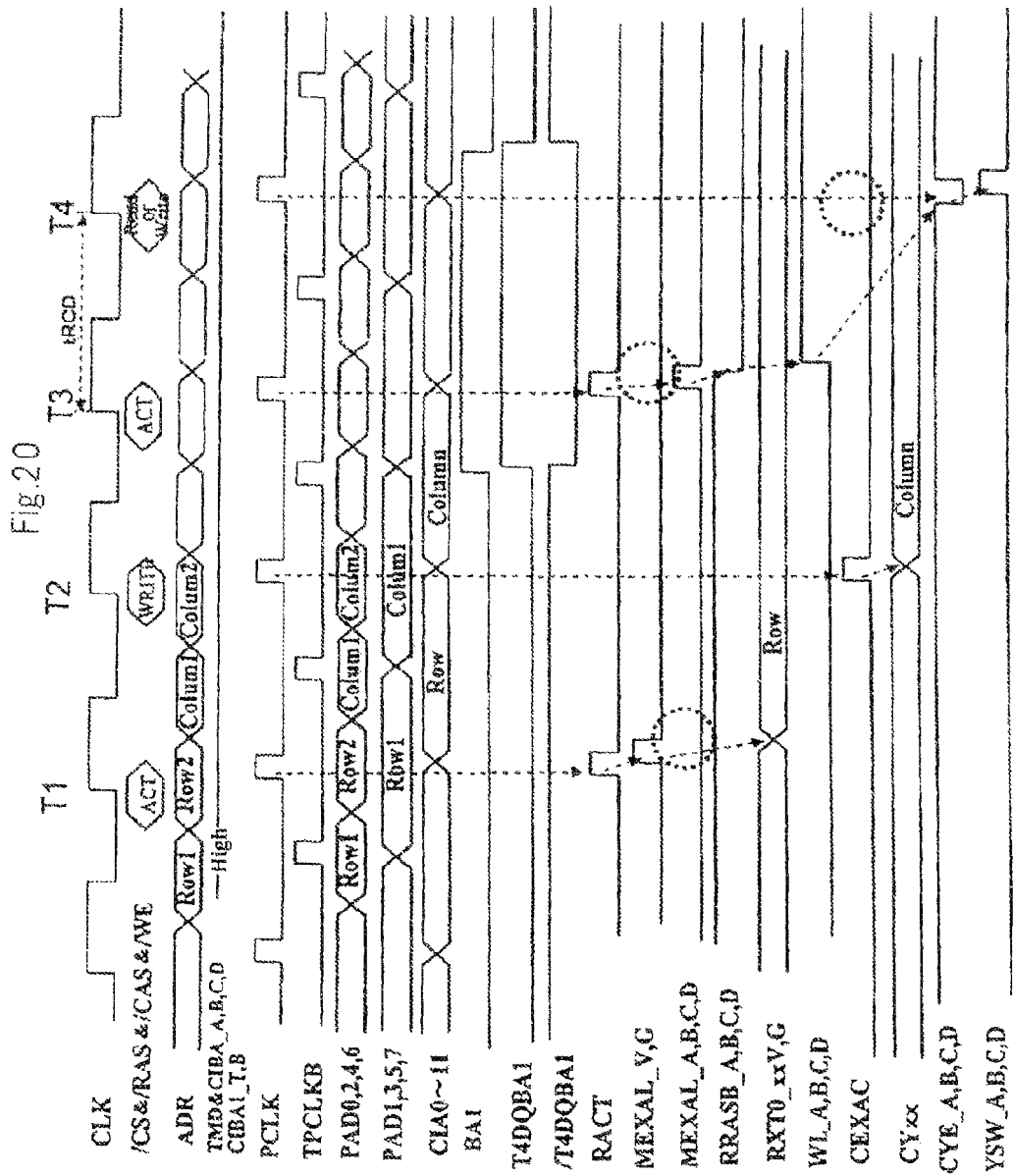
FIG. 20 is a timing chart illustrating the operation of the semiconductor memory device of the first exemplary embodiment.

Operation of the present exemplary embodiment will now be explained with reference to the timing diagram in FIG. 20. In FIG. 20, several contents are denoted by the same reference characters as FIG. 12, 13 or 14 to omit the further description thereof. In FIG. 20, times at which active command ACT and write command Write are input by rendering bank address signal BA1 low, are designated T1 and T2, respectively.

Figure 10:
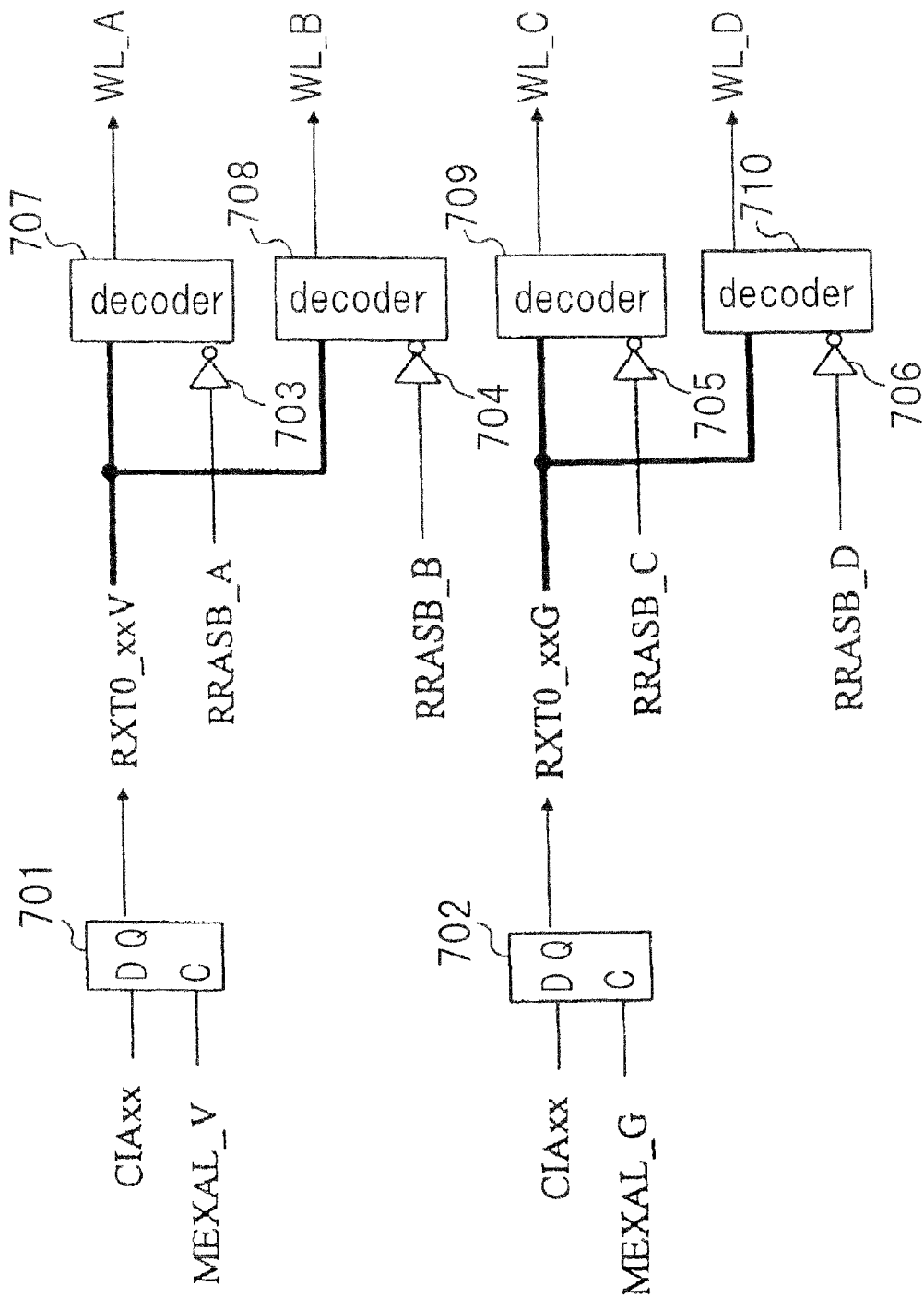
FIG. 10 is a circuit diagram of a row decoder shown in FIG. 1.

At time T1, as is the case with the related semiconductor memory device, pulse signal PCLK is generated, and active command determination circuit 12 detects the input of active command ACT and generates pulse signal RACT. However, in row-side control circuit 16 (FIG. 18), since signal /T4DQBA1 is at a high level, signals MEXAL_A to MEXAL_D remain low, and signals MEXAL_V and MEXAL_G alone are generated. Accordingly, signals RRASB_A to RRASB_D remain high, and address CIAxx corresponding to an external address input is latched to D flip-flops 701 and 702 and are output as signals RXT0_xxV and RXT0_xxG. However, since signals RRASB_A to RRASB_D remain high, decoders 707 to 710 (FIG. 10) do not operate and word lines WL_A to WL_D are not selected.

Figure 11:
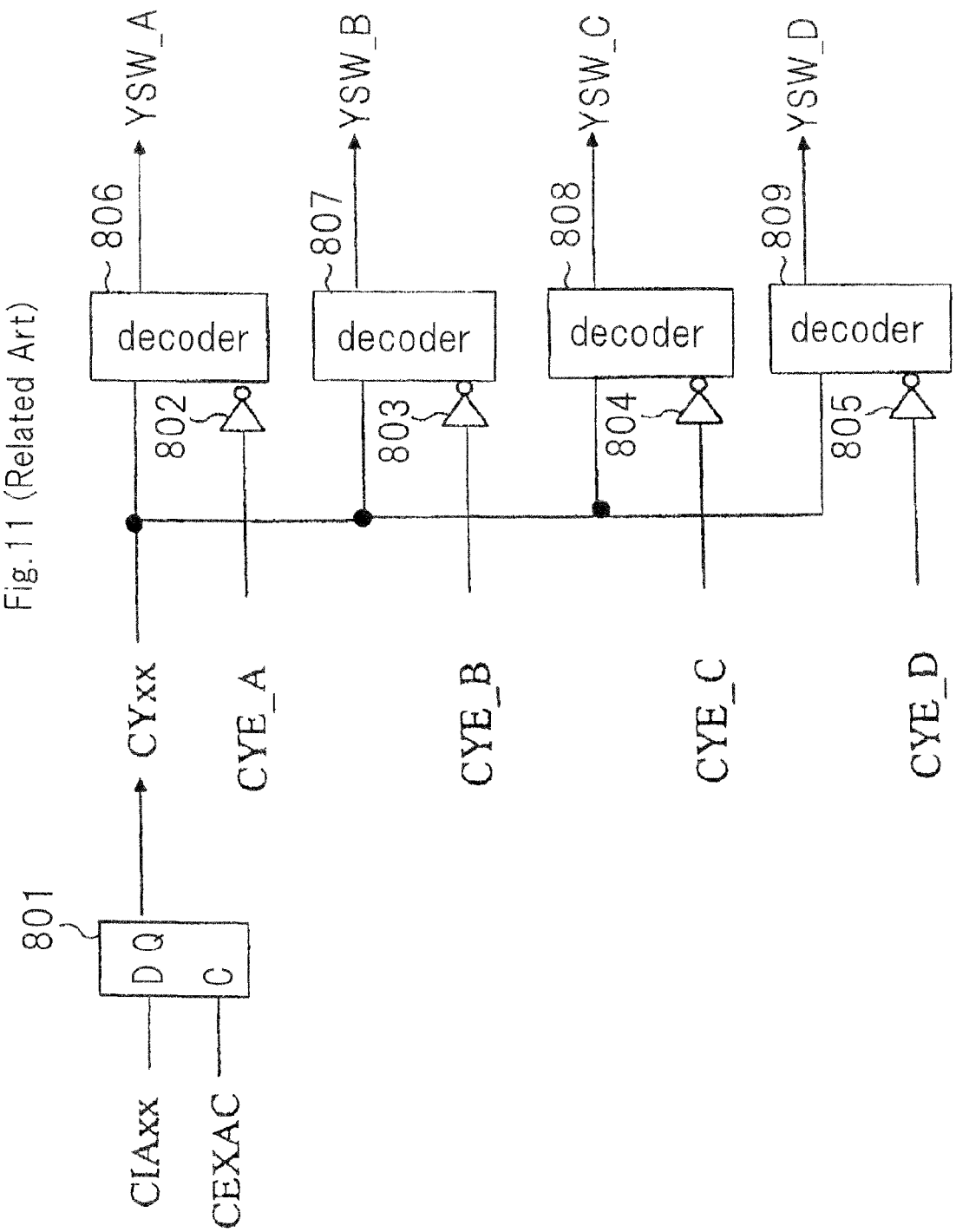
FIG. 11 is a circuit diagram of a column decoder shown in FIG. 1.

Next, at time T2 at which write command Write is input, signal T4DQBA1 is at a low level. Accordingly, write/read command determination circuit 13 renders its output signals CEXAC and CYE_A to CYE_D high and D flip-flop 801 (FIG. 11) latches address CIAxx corresponding to an external address input which is latched with low and high levels of the clock signal, as in the case when active command ACT is input. However, since signals RRASB_A to RRASB_D remain high and signals CYE_A to CYE_D are therefore high in column-side control circuit 17 (FIG. 9), decoders 806 to 809 (FIG. 11) do not operate and Y switches YSW_A to YSW_D are not selected.

As a result of the operations described above, row addresses CIAxx are held in latch circuits 701 and 702 in row decoder 4 and column addresses CIAxx are held in latch circuit 801 in column decoder 5.

Next, bank address signal BA1 is rendered high and active command ACT and write command Write are input. The times at which active command ACT and write command Write are input are designated T3, T4, respectively. The logical levels of signals T4DQBA1 and /T4DQBA1 at times T3 and T4 are opposite to those at times T1 and T2. However, at time T3 at which active command ACT is input, output MEXAL_V and MEXAL_G of row-side control circuit 16 (FIG. 18) remain low, and signals RRASB_A to RRASB_D are low. Thus, row decoder 4 can operate in this way. At this time, since the latch circuits (D flip-flops 701, 702) that receive addresses as inputs do not operate, a word line that was obtained by decoding the address that is latched at time T1 is selected. When a write/read command is input at time T4, write/read command determination circuit 13 does not generate signal CEXAC but generates signal CYE alone. As a result, D flip-flop 801 latches the address that is input at the previous time T2 and outputs it as an address CYxx. Since CYE_A to CYE_D (FIG. 9) are rendered active, Y switch associated with the decoder that has decoded address CYxx is selected. Accordingly, by performing tRCD measurement with bank address signal BA1 rendered high, it is possible to evaluate the performance of tRCD without being affected by the amount of time that is used to capture addresses.

Thus, according to the first exemplary embodiment, an operation cycle in which an address is captured in the latch circuit in row decoder 4 or column decoder 5 and a cycle in which tRCD measurement is performed, can be done as separate cycles. This makes it possible to evaluate the performance of tRCD without being affected by the amount of time that is used to capture addresses.

2nd Exemplary Embodiment

Figure 21:
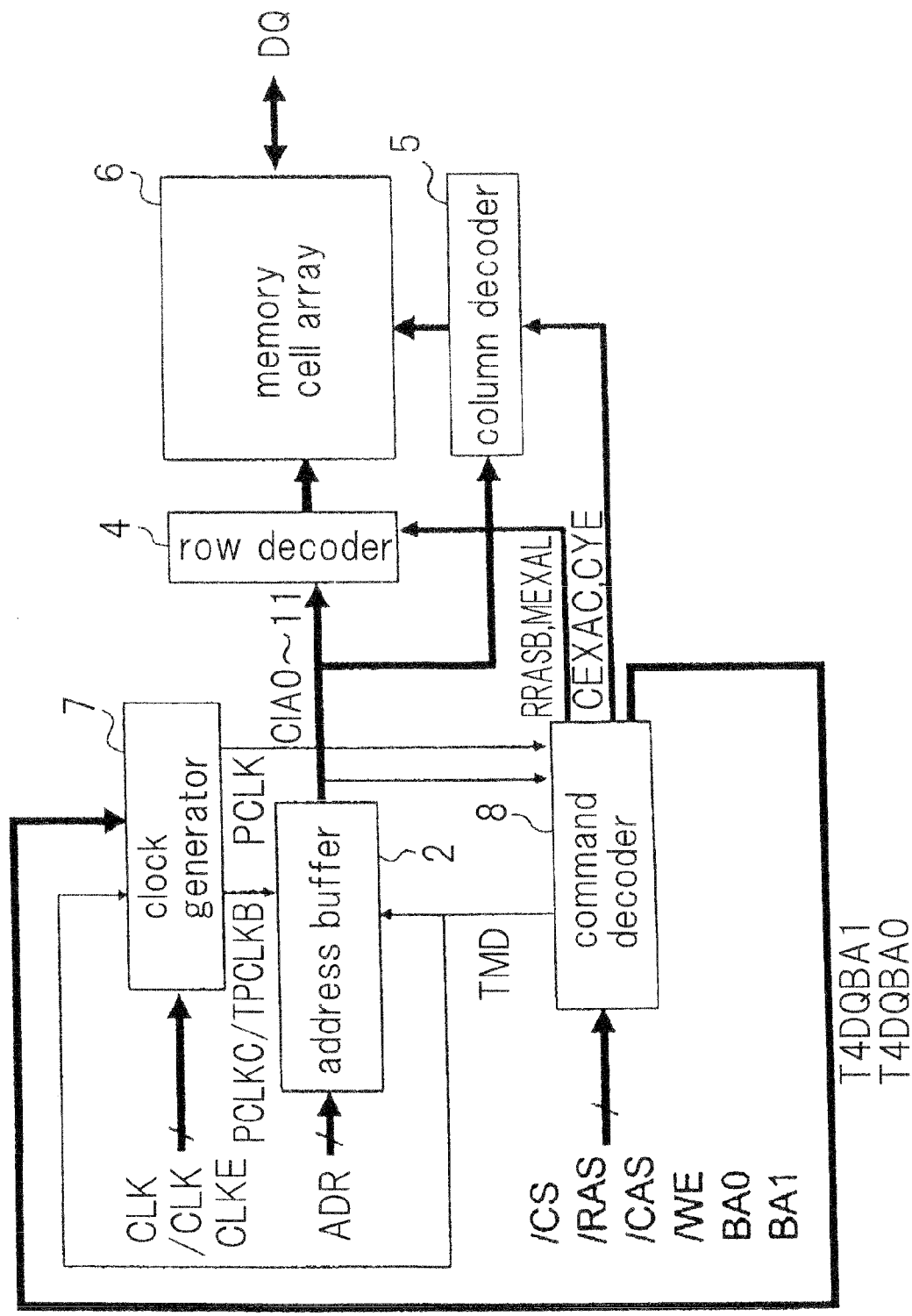
FIG. 21 is a block diagram of a semiconductor memory device according to a second exemplary embodiment of the present invention.

FIG. 21 is a block diagram of a semiconductor memory device according to a second exemplary embodiment of the present invention. The semiconductor memory device of the second exemplary embodiment comprises clock generator 7, address buffer 2, command decoder 8, row decoder 4, column decoder 5 and memory cell array 6. The semiconductor memory device of the second exemplary embodiment differs from the semiconductor memory device shown in FIG. 1 in that clock generator 7 and command decoder 8 differ from clock generator and command decoder 9, respectively. Therefore, the remaining contents of FIG. 21 are denoted by the same reference characters as FIG. 1 to omit the further descriptions thereof.

Figure 2:
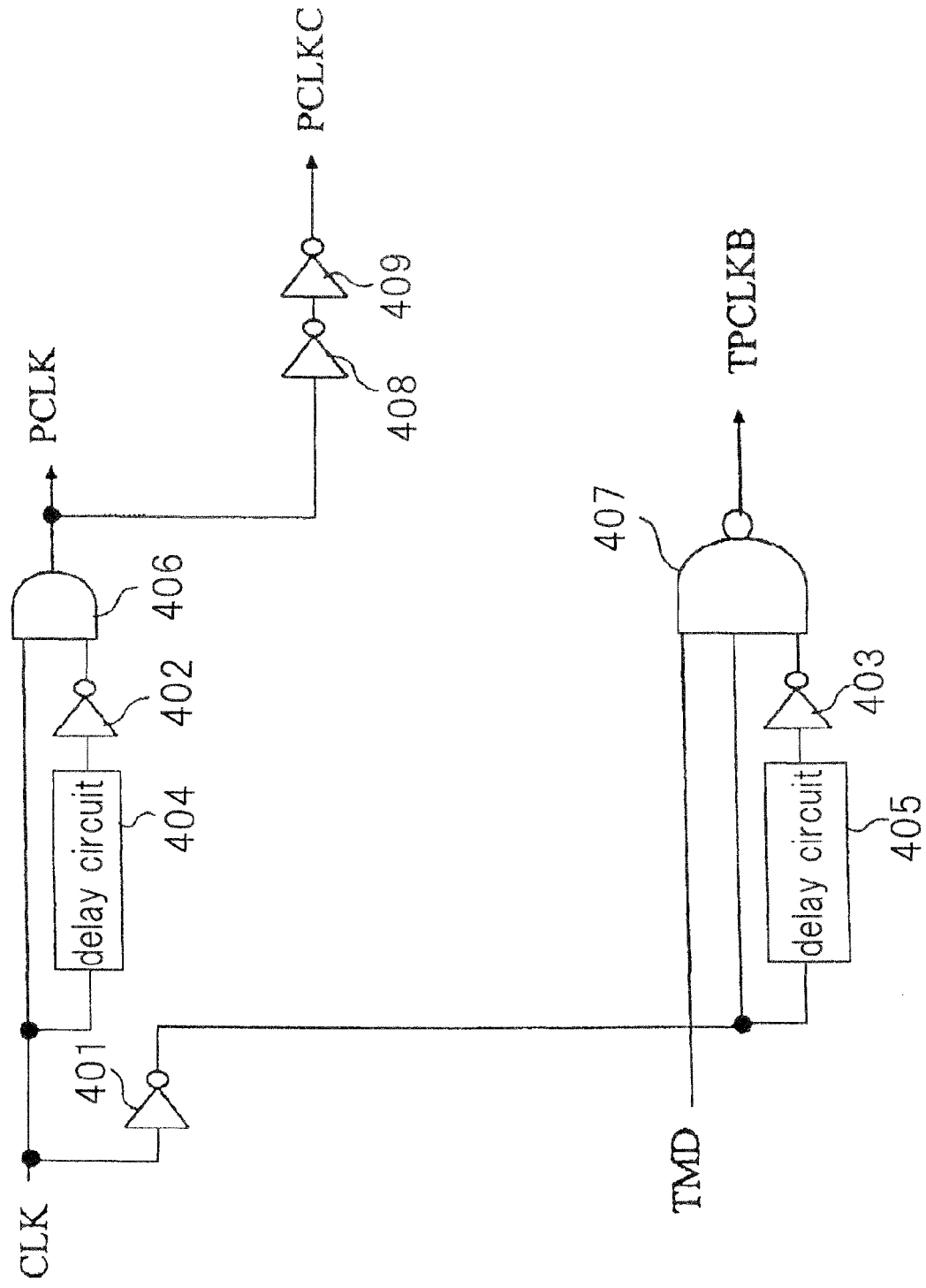
FIG. 2 is a circuit diagram of a clock generator shown in FIG. 1.
Figure 3:
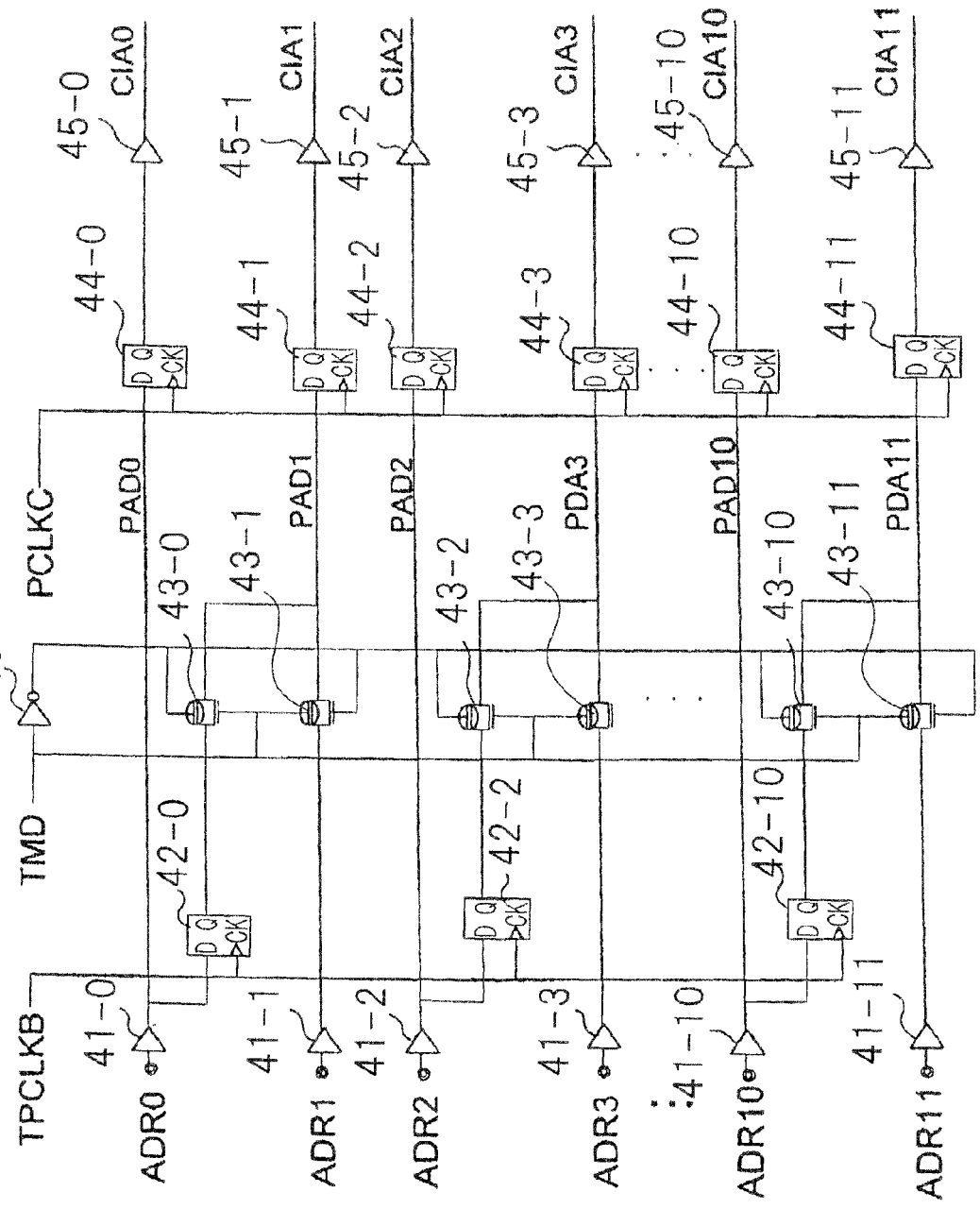
FIG. 3 is a circuit diagram of an address buffer shown in FIG. 1.
Figure 22:
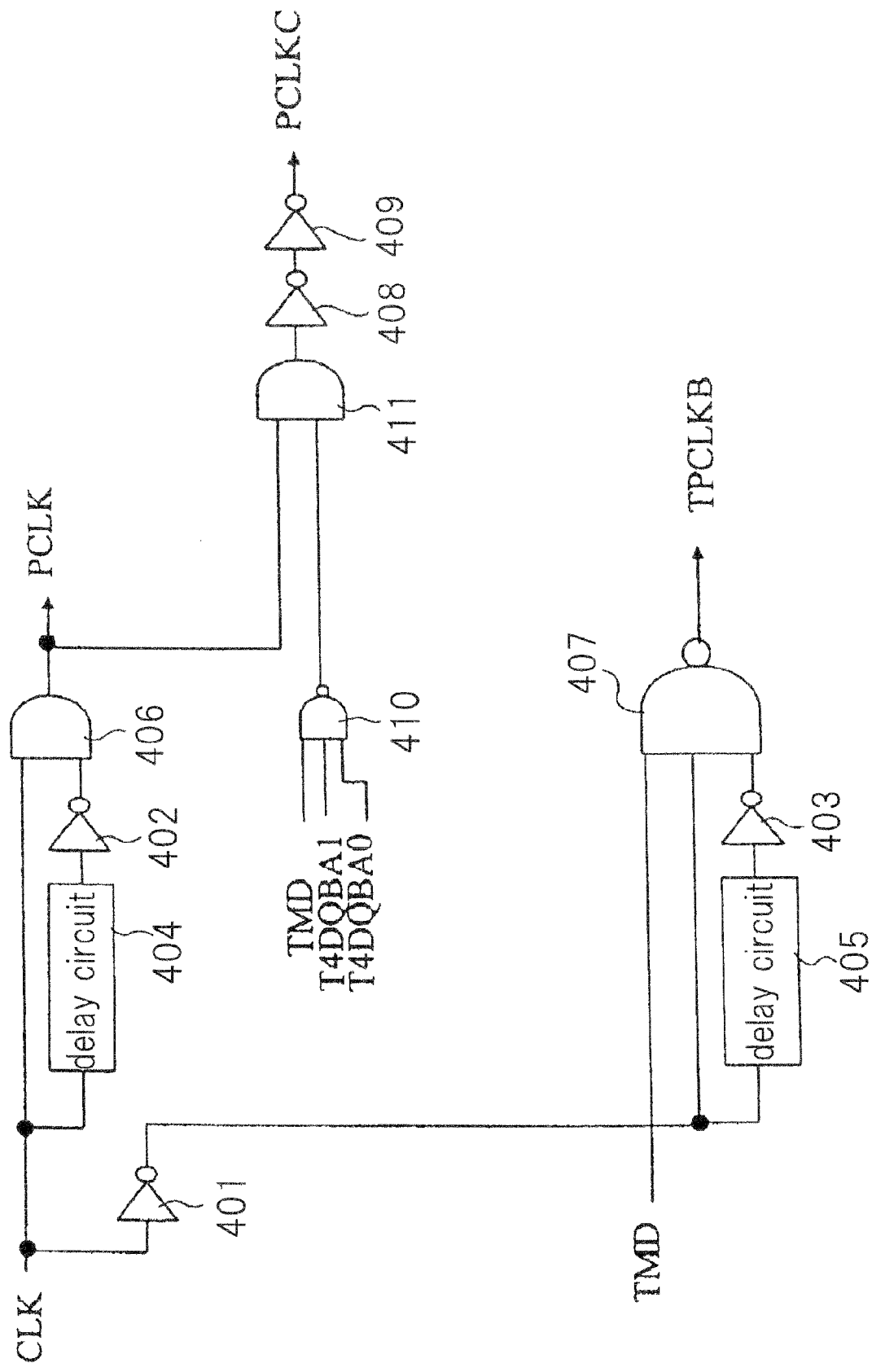
FIG. 22 is a circuit diagram of a clock generator shown in FIG. 21.

FIG. 22 is a circuit diagram of clock generator 7. Clock generator 7 has a configuration wherein NAND 410 that receives test mode signal TMD and output signals T4DQBA0 and T4DQBA1 of bank-side selection circuit 5 shown in FIG. 17, and AND gate 411 that receives output signals of AND gate 406 and NAND date 410, have been added to clock generator 1 shown in FIG. 2.

Figure 23:
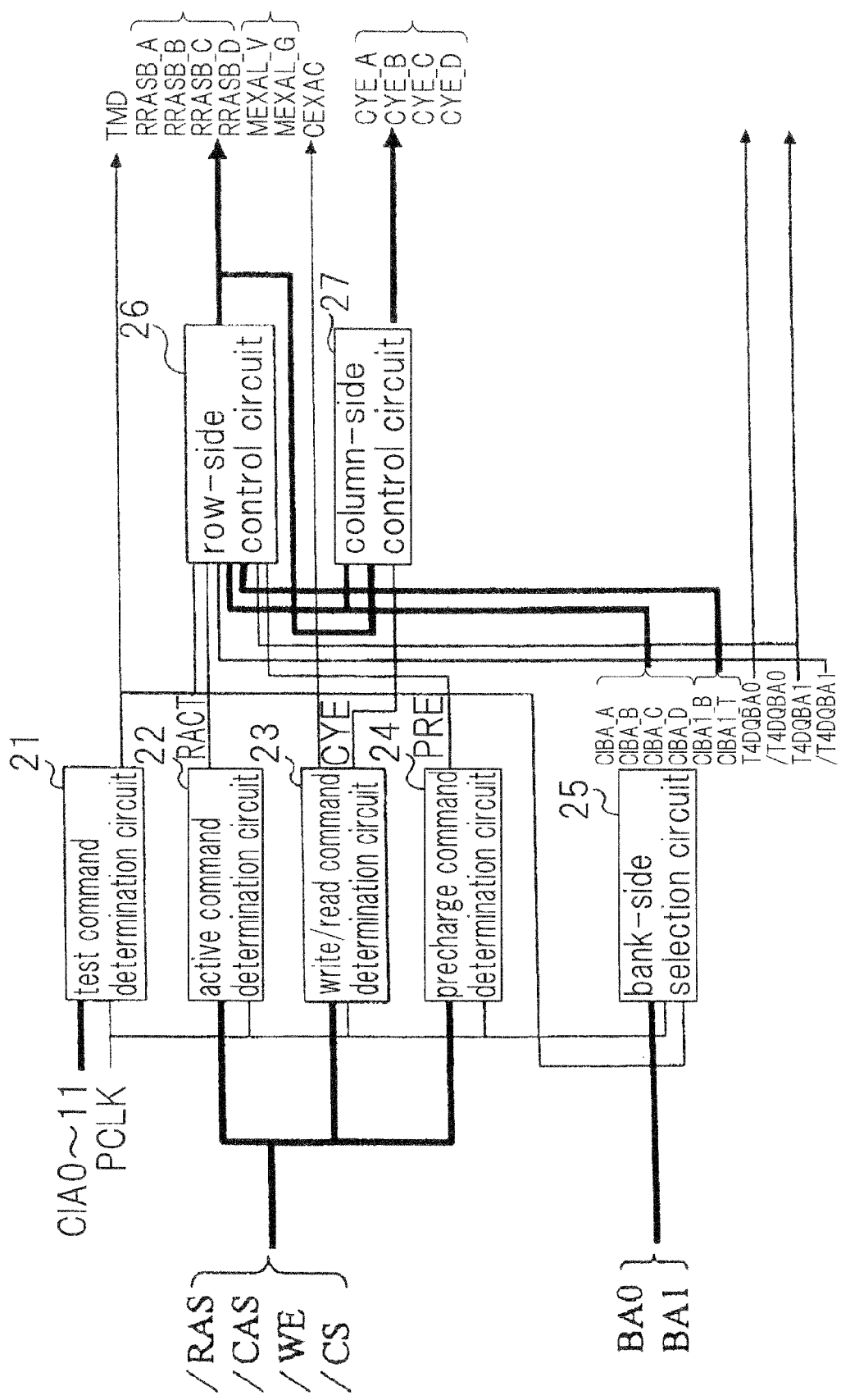
FIG. 23 is a block diagram of a command decoder shown in FIG. 21.

FIG. 23 is a block diagram of command decoder 8. Command decoder 8 includes test command determination circuit 21, active command determination circuit 22, write/read command determination circuit 23, precharge command determination circuit 24, bank-side selection circuit 25, row-side control circuit 26 and column-side control circuit 27. Bank-side selection circuit 25 and row-side control circuit 26 are the same as bank-side selection circuit 15 and row-side control circuit 16 in the first exemplary embodiment, respectively.

In the first exemplary embodiment, the input of write command Write at time T2 is needed. However, in the present exemplary embodiment, a Y switch address is latched at time T2 without it being necessary to input write command Write.

Figure 24:
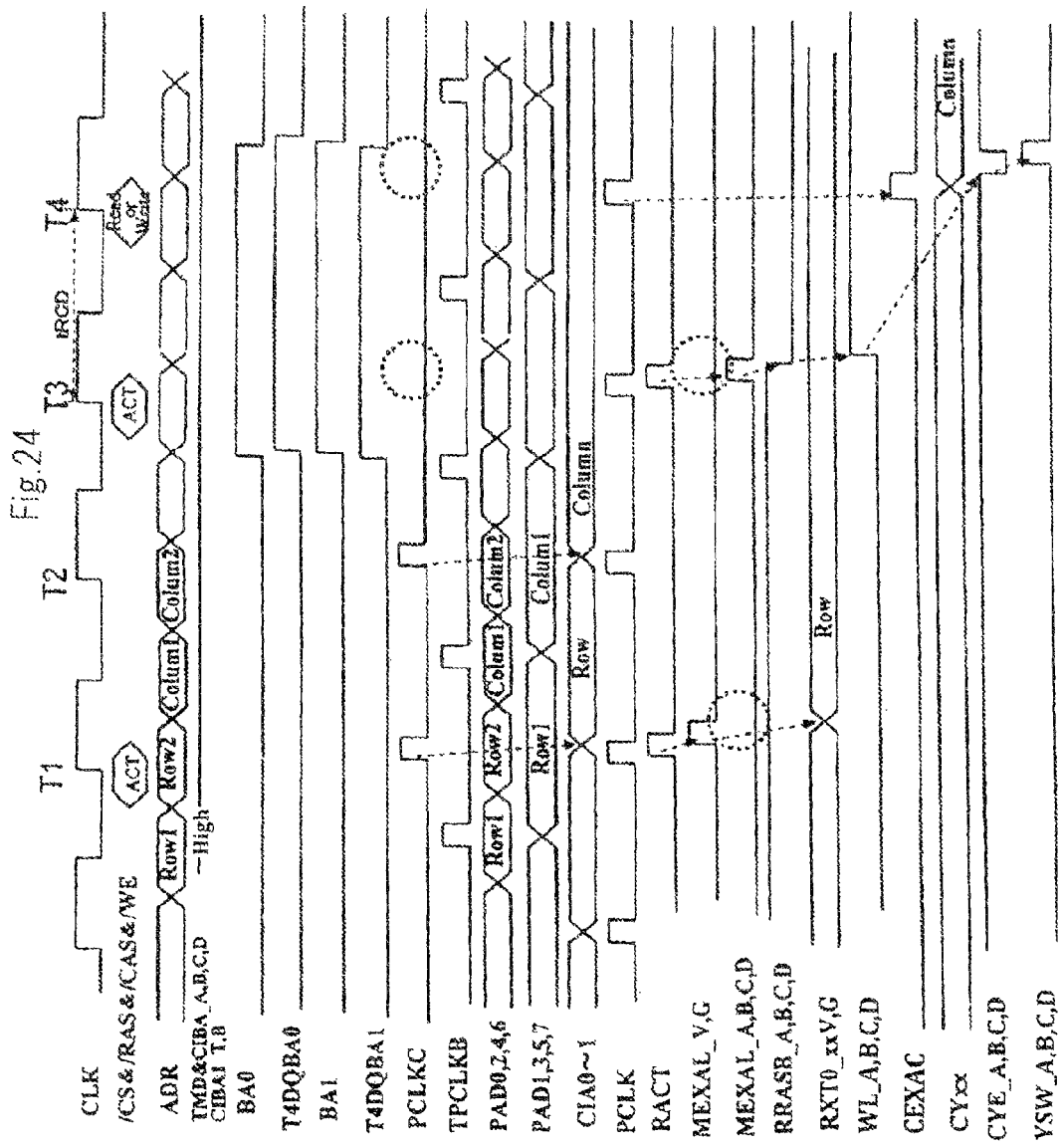
FIG. 24 is a timing chart illustrating the operation of a semiconductor memory device of a second exemplary embodiment.

Operation of the present exemplary embodiment will now be explained with reference to the timing diagram in FIG. 24. In FIG. 24, several contents are denoted by the same reference characters as FIG. 20 to omit the further descriptions thereof. Operations at times T1 and T3 are identical to those at times T1 and T3 of the first exemplary embodiment and explanations thereof are omitted. Since signal PCLKC is generated when bank address signals BA0 or BA1 is rendered low at time T2, external addresses are latched as addresses CIA0 to CIA12. Next, at times T3 and T4, bank address signals BA0 and BA1 are rendered high and active command ACT and the write/read command are input. At time T4, signal PCLKC is not generated and signal PCLK alone is generated. As a result, signal CEXAC is rendered active, and normal Y switch selection operation is activated. A Y switch is selected based on the address at the previous time T2 as a column selection address. At time T4, clock PCLKC is controlled such that the address latched at time T2 is not updated. Accordingly, an ample amount of time to set up a column address to be captured when the read/write command is input at time T4 can be secured. The result is that tRCD between T3 and T4 is not limited by the amount of time that is used to set up the column address. The reason why bank address signal BA0 is also used to stop signal PCLKC is to prevent addresses from not being captured at the input of a mode register set command when the bank address signal BA1 is rendered high.

Thus, unlike the first exemplary embodiment, the second exemplary embodiment has a configuration wherein capturing a column address from address buffer 2 to the latch circuit in column decoder 5 is performed at time T4 at which the write/read command is input. To this end, the second exemplary embodiment is configured such that a desired column address is latched in the latch circuit in address buffer 2 before the start of the tRCD measurement, and thereafter the control clock (PCLKC) for the latch circuit in address buffer 2 is deactivated until the completion of the tRCD measurement. This configuration allows capturing a column address at the timing of input read or write command to be performed in a manner similar to the case in which address degeneracy is not performed. Therefore, accurate measurement of the performance of tRCD is made possible.

In the first and second exemplary embodiments, switching of operations (switching of operation cycles in the first exemplary embodiment and switching of active/inactive of clock PCLK in the second exemplary embodiment) is performed by using, in particular, a bank address signal. This bank address signal can not be degenerated because it needs to be input from the outside for MRS (Mode Register Set) at the entry of the test mode. However, the bank address signal is not used after the entry of the test mode. Therefore, by using the bank address signal which is a signal that is needed at the entry of the test mode but is not used during the test, control of switching of operations, such a degeneracy test as described in the first and second exemplary embodiments, can be performed without adding pins for the switching. Further, by controlling the switching using a signal that is unnecessary during the test, the switching can be performed asynchronous to the clock OLK.

3rd Exemplary Embodiment

Figure 25:
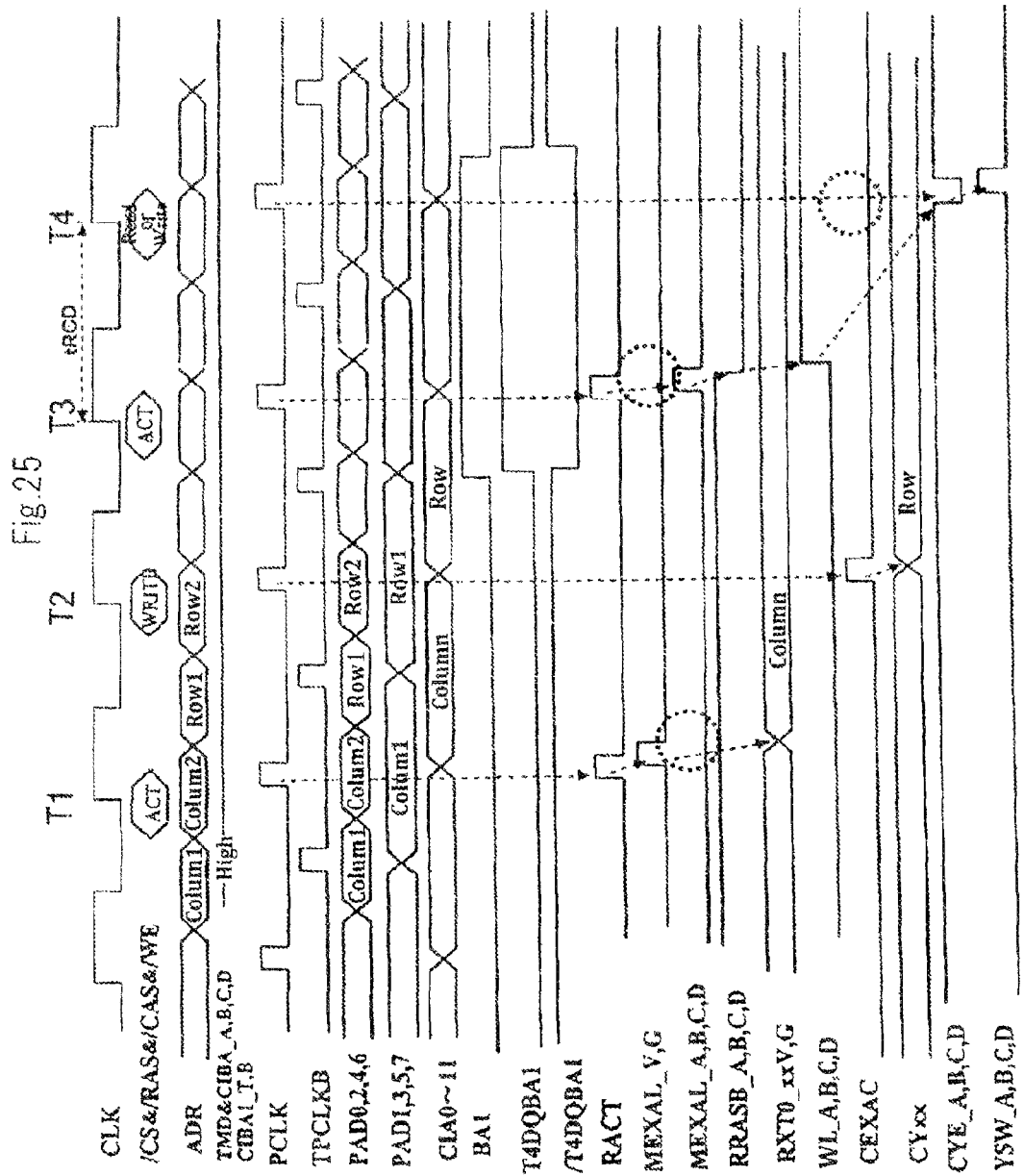
FIG. 25 is a timing chart illustrating the operation of a semiconductor memory device of a third exemplary embodiment.

FIG. 25 is a timing chart illustrating the operation of a semiconductor memory device of a third exemplary embodiment. This exemplary embodiment is a modification of the first exemplary embodiment wherein the column address is input in address buffer 2 earlier than the row address. The operation of this exemplary embodiment is similar to that of the first exemplary embodiment and an explanation thereof is omitted.

4th Exemplary Embodiment

FIG. 26 is a timing chart illustrating the operation of the semiconductor memory device of the fourth exemplary embodiment. This exemplary embodiment is a modification of the second exemplary embodiment wherein the column address is input in address buffer 2 earlier than the row address. The operation of this exemplary embodiment is similar to that of the second exemplary embodiment and an explanation thereof is omitted.

In the exemplary embodiments as described above, the number of banks in a semiconductor memory device is four. However, the number of banks may be any number that is not less than two. Further, although the address has a 12-bit length in the exemplary embodiments, the number of bits that constitute the address is not limited thereto.

While preferred exemplary embodiments of the present invention have been described using specific terms, such description is for illustrative purposes only, and it is to be understood that changes and variations may be made without departing from the spirit or scope of the following claims.

The invention claimed is:

1. A semiconductor device having a normal operation mode and a test operation mode, comprising:
    a plurality of memory cells;
    a plurality of word lines each coupled to a corresponding one or ones of the memory cells; and
    a row control circuit performing a first row operation in which a row address is updated in response to a first active command without activating one or ones of the word lines designated by the row address and a second row operation in which the one or ones of the word lines is activated in response to a second active command following the first active command without updating the row address.

2. The device according to claim 1, wherein the memory cells divide into a plurality of banks, the row control circuit performing one of the first row operation and the second row operation in response to a logic level of a bank address signal in the test operation mode and the bank address signal serves as a signal selecting one or ones of the bank in the normal operation mode.

3. The device according to claim 1, wherein the row control unit includes a row control signal generating portion and a row decoder portion, the row control signal generating portion supplies a first row control signal to the row decoder portion in response to the first active command and a logic level of a bank address signal and supplies a second row control signal to the row decoder portion, the first row control signal is supplied so as to control to update the row address and the second row control signal is supplied so as to control to activate the one or ones of the word lines.

4. The device according to claim 3, wherein the row control signal generation portion provides the first row control signal to update the row address in response to a receipt of the first active command and a first logic level of the bank address signal and provides the second row control signal to activate the one or ones of the word lines in response to a receipt of the second active command and a second logic level of the bank address signal.

5. The device according to claim 4, wherein the row decoder portion includes a row latch circuit holding the row address and a row decode circuit decoding the row address and activating the one or ones of the ward lines.

6. The device according to claim 3, further comprising:
    a test mode signal generating circuit configured to supply a test mode signal to the row control unit and configured to activate the test mode signal in response to a receipt of a predetermined address signal, and wherein the row control unit performs one of the first row operation and the second row operation in response to an activation of the test mode signal.

7. The device according to claim 1, further comprising:
    a plurality of pairs of bit lines each coupled to corresponding ones of the memory cells; and
    a column control circuit performing a first column operation in which a column address is updated in response to a first read/write command without selection of one or ones of the pairs of bit lines designated by the column address and a second column operation in which one or ones of the pairs of bit lines in response to a second read/write command following the first read/write command without updating the column address.

8. The device according to claim 7, wherein the memory cells divide into a plurality of banks, the column control circuit performing one of the first column operation and the second column operation in response to a logic level of a bank address signal in the test operation mode and the bank address signal serves as a signal selecting one or ones of the bank in the normal operation mode.

9. The device according to claim 7, wherein the column control unit includes a column control signal generating portion and a column decoder portion, the column control signal generation portion configured to supply a first column control signal to the column decoder portion in response to the first read/write command and a logic level of a bank address signal and configured to supply a second column control signal to the column decoder portion, the first column control signal supplied so as to control to update the column address and the second column control signal supplied so as to control to select the one or ones of the pairs of bit lines.

10. The device according to claim 9, wherein the column signal generating portion provides the first column control signal to update the column address in response to a receipt of the first read/write command and a first logic level of the bank address signal and provides the second column control signal to select the one or ones of the pairs of bit lines in response to a receipt of the second read/write command and a second logic level of the bank address signal.

11. The device according to claim 10, wherein the column decoder portion includes a column latch circuit holding the column address and a column decode circuit decoding the column address and selecting the one or ones of the pair of bit lines.

12. The device according to claim 3, further comprising:
a test mode signal generating circuit supplying a test mode signal to the column control unit and activating the test mode signal in response to a receipt of a predetermined address signal, and wherein the column control unit performs one of the first column operation and the second column operation in response to an activation of the test mode signal.

* * * * *